United States Patent [19]
Maeda

[11] Patent Number: 5,608,338
[45] Date of Patent: Mar. 4, 1997

[54] EVALUATING THE LIFETIME AND RELIABILITY OF A TFT IN A STRESS TEST USING GATE VOLTAGE AND TEMPERATURE MEASUREMENTS

[75] Inventor: Shigenobu Maeda, Hyogo, Japan

[73] Assignee: Mitsubishi Denki Kabushiki Kaisha, Tokyo, Japan

[21] Appl. No.: 533,659

[22] Filed: Sep. 25, 1995

[30] Foreign Application Priority Data

Apr. 25, 1995 [JP] Japan .................................. 7-101179

[51] Int. Cl.$^6$ ........................................ G01R 31/26
[52] U.S. Cl. ...................... 324/770; 324/71.3; 136/290; 250/310
[58] Field of Search .................... 324/770, 71.3; 136/290; 250/310; 350/333, 332

[56] References Cited

U.S. PATENT DOCUMENTS

4,899,105  2/1990  Akiyama ................... 324/770

FOREIGN PATENT DOCUMENTS

6-326315  11/1994  Japan .

OTHER PUBLICATIONS

"Mechanism of Negative–Bias Temperature Instability in Polycrystallinesilicon thin film transistors" Madea et al., Journal of Applied Physics, vol. 76 (12), Dec. 1994, pp. 8160–8166.

"Appearance of Single–Crystalline Properties in Fine–Patterned Si Thin Film Transistors (TFTs) by Solid Crystallization (SPC)" Noguchi, Journal of Applied Physics, vol. 32, 1993, pp. L1584–L1587 Jul. 23, 1993.

Primary Examiner—Kenneth A. Wieder
Assistant Examiner—Barry C. Bowser
Attorney, Agent, or Firm—Lowe, Price, LeBlanc & Becker

[57] ABSTRACT

Time coefficient $\beta$, voltage coefficient d and temperature coefficient $\phi_0$ of a jumbo TFT including a plurality of TFTs connected parallel to each other and manufactured under the same condition are obtained through experiment using $-$BT stress test, mean value $\mu$ and standard deviation $\sigma$ of the threshold voltage shift amount are calculated by $-$BT stress test for a plurality of individual TFTs, and the life t of the individual TFT is evaluated by the expression:

$$\tau = t_0 \left\{ \frac{\Delta V_{th\tau}/(1 - m|\sigma/\mu|)}{\Delta V_{th0}} \right\}^\beta \exp\frac{\beta q \phi_0}{kT} \exp\left(-\frac{\beta q d |V_G|}{2kT_{ox}}\right). \quad (8)$$

8 Claims, 14 Drawing Sheets

F I G. 4
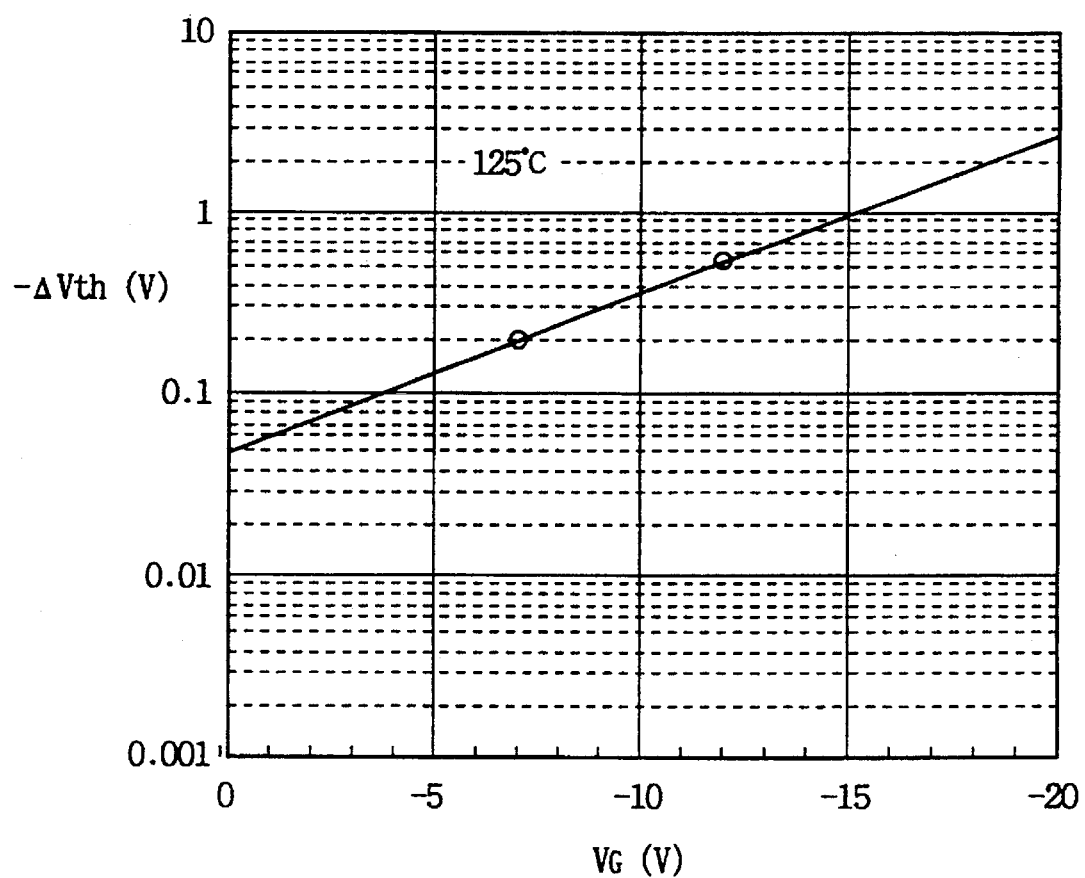

F I G. 1 4 PRIOR ART
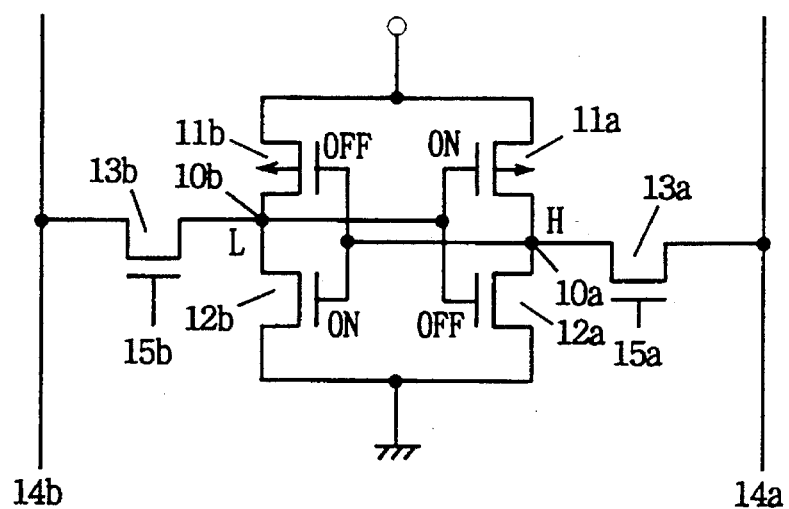
F I G. 1 5 PRIOR ART
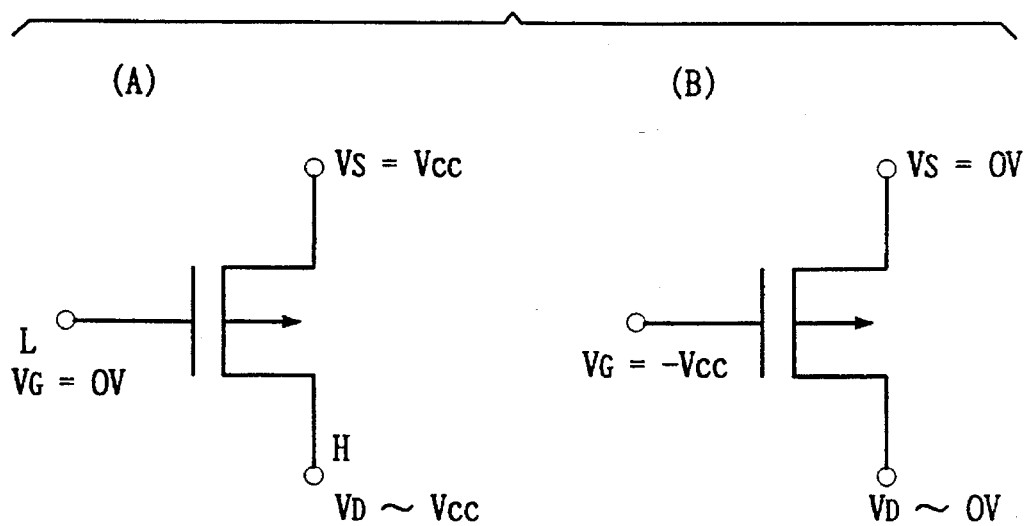

EVALUATING THE LIFETIME AND RELIABILITY OF A TFT IN A STRESS TEST USING GATE VOLTAGE AND TEMPERATURE MEASUREMENTS

BACKGROUND OF THE INVENTION

1. Field of the Invention

The present invention relates to a method of evaluating reliability of a TFT (Thin Film Transistor) and, more specifically, to a method of evaluating reliability of a TFT including a channel layer of silicon thin film and a gate insulating film of silicon oxide.

2. Description of the Background Art

In an SRAM (Static Random Access Memory) device, it is possible to retain data for a long period of time by using a battery. One of the important factors representing the performance of this device includes a so called "hold lower limit voltage". The hold lower limit voltage means the lower limit value of the voltage at which the data can be correctly held in the SRAM device.

FIG. 14 shows an example of an equivalent circuit of an SRAM cell. The SRAM cell includes a pair of storage nodes 10a and 10b; a pair of load transistors 11a and 11b; a pair of driver transistors 12a and 12b; a pair of access transistors 13a and 13b; a pair of bit lines 14a and 14b; and a pair of word lines 15a and 15b. More specifically, in the SRAM cell, data is stored by a flipflop including two driver transistors 12a and 12b as well as two load transistors 11a and 11b by maintaining one storage node at H (high) level and maintaining the other storage node at L (low) level.

Now, assume that the storage node 10a is at H level. Then, load transistor 11a is ON, while driver transistor 12a is OFF. In other words, the state in which storage node 10a is at the H level corresponds to the state in which ON current of load transistor 11a is larger than the OFF current of driver transistor 12a.

Recently, load transistors of the SRAM cells increasingly come to be manufactured by using TFTs. However, in an SRAM cell including a TFT load transistor, ON current of load TFT 11a gradually reduces while it is used retaining data for a long period of time, and eventually it becomes smaller than the OFF current of driver transistor 12a. As a result, data at the H level may possibly be erroneously replaced by L level. The problem causing such an error is referred to as "hold defect". In order to avoid hold defect in the SRAM cell, it is necessary to well understand the properties of the TFT in which ON current decreases during use over a long period of time.

When the SRAM cell holds data, the load TFT on the side of the storage node 10a which is at the H level, is at such a voltage state as shown in FIG. 15 (A). In FIG. 15(A), a reference character $V_S$ represents source voltage, $V_D$ represents drain voltage, $V_G$ represents gate voltage and Vcc represents power supply voltage. The voltage state of the TFT shown in FIG. 15(A) is equivalent to the voltage state shown in FIG. 15(B). The voltage state of the TFT shown in FIG. 15(B) is referred to as "−BT stress state."

Degradation in the TFT characteristic caused by −BT stress is reported in detail by Maeda et al., in *J. Appl. Phys.*, Vol. 76 (12), 1994, pp. 8160–8166. According to this article of Maeda et al., threshold voltage of the TFT shifts in the negative direction by the −BT stress, as shown in FIG. 16. More specifically, in FIG. 16, the abscissa represents gate voltage $V_G$ while the ordinate represents drain current $I_D$ in logarithmic scale. Curves 16A and 16B represent characteristics of TFT before and after −BT stress. The inventors of the present invention disclosed a method of accurately predicting an amount of shift of the threshold voltage of the TFT caused by −BT stress in Japanese Patent Laying-Open No. 6-326315. If the amount of shift of the threshold voltage is predicted in accordance with the method disclosed in Japanese Patent Laying-Open No. 6-326315 and if initial threshold voltage of the TFT is set appropriately in advance, it is possible to provide an SRAM device which does not suffer from hold defect even after it holds data for a long period of time.

However, the channel layer of the TFT is formed of a polycrystalline silicon thin film, and therefore among a plurality of TFTs manufactured under the same manufacturing conditions, initial characteristics of the TFTs vary as shown in FIG. 17. In addition, characteristics after −BT stress also vary widely, because of vibration in density of crystal grain boundary in the channel layer. Therefore, in the SRAM device, there is a high possibility of hold defect after it holds data for a long period of time, unless the amount of shift of the threshold voltage of the TFT having worst performance after −BT stress is estimated.

Conventionally, a TFT having a polycrystalline silicon thin film of which crystal grain diameter is relatively small with respect to the channel length has been used in the SRAM. Therefore, variation in the characteristics of the TFTs such as shown in FIG. 17 is small. Therefore, estimation of the amount of shift of the threshold value in the TFTs in accordance with the method disclosed in the aforementioned Japanese Patent Laying-Open No. 6-326315 has been sufficient. However, in order to minimize the size of the TFT, channel length becomes shorter, while the crystal grain diameter of the polycrystalline thin film is made larger in order to increase drain current. Accordingly, variation of the grain boundary density of polycrystalline silicon in the channel layer becomes larger in the individual TFT, and variation in the characteristics of TFTs becomes innegligible. Variation in the characteristics of TFTs caused by the dimensional relation between the grain diameter of polycrystalline silicon and the channel length is described in detail by Noguchi in Jpn. *J. Appl. Phy.*, Vol. 32, 1993, pp. L1584-L1587.

Now, −BT stress degradation of TFT characteristics is closely related to dangling bond density and ratio of hydrogenation of silicon atoms in a polycrystalline silicon thin film. The dangling bond density and the ratio of hydrogenation of a polycrystalline silicon film by itself can be measured by using an ESR (Electronic Spin Resonance) apparatus. However, the dangling bond density and the ratio of hydrogenation of a polycrystalline silicon film in a finished TFT cannot be measured by the ESR apparatus. Therefore, there is a strong demand for development of a method of easily estimating the dangling bond density and the ratio of hydrogenation in the polycrystalline silicon thin film in a finished TFT.

SUMMARY OF THE INVENTION

In view of the problems of the prior art described above, an object of the present invention is to provide a method of evaluating reliability of an individual TFT taking into consideration variation of characteristics of a plurality of TFTs manufactured under the same manufacturing conditions. Another object of the present invention is to provide a method of estimating the dangling bond density and the ratio of hydrogenation of silicon atoms in a polycrystalline silicon thin film, which has close relation to the reliability of the TFT, by utilizing –BT stress test.

A method of evaluating the reliability of a TFT according to a first aspect of the invention, in a TFT having a channel layer of a polycrystalline silicon thin film and a gate insulating film of a silicon oxide film manufactured under a prescribed manufacturing condition, evaluates the reliability of the TFT in the BT stress state in which the gate is supplied with an arbitrary negative constant voltage $V_G$ and maintained at an arbitrary constant temperature T based on the following expressions:

$$\Delta V_{th} \propto t^\alpha \tag{2a}$$

$$\Delta V_{th} \propto \exp\frac{qd|V_G|}{2kTt_{ox}} \tag{3a}$$

$$\Delta V_{th} \propto \exp\left\{-\frac{q}{kT}\left(\phi_0 - \frac{d|V_G|}{2t_{ox}}\right)\right\} \tag{4a}$$

$$\Delta V_{th} = \Delta V_{th0}\left(\frac{t}{t_0}\right)^\alpha \exp\left\{-\frac{q}{kT}\left(\phi_0 - \frac{d|V_G|}{2t_{ox}}\right)\right\} \tag{5}$$

$$\tau_0 = t_0\left(\frac{\Delta V_{th\tau}}{\Delta V_{th0}}\right)^\beta \exp\frac{\beta q\phi_0}{kT}\exp\left(-\frac{\beta qd|V_G|}{2kTt_{ox}}\right) \tag{7}$$

$$\tau = t_0\left\{\frac{\Delta V_{th\tau}/(1-m|\sigma/\mu|)}{\Delta V_{th0}}\right\}^\beta \exp\frac{\beta q\phi_0}{kT}\exp\left(-\frac{\beta qd|V_G|}{2kTt_{ox}}\right) \tag{8}$$

where $\Delta V_{th}$ represents the threshold voltage shift amount of a jumbo TFT including a plurality of TFTs connected parallel to each other and manufactured under a prescribed manufacturing condition, t time, α time coefficient, q elementary electric charge, d voltage coefficient, k Boltzman constant, $t_{ox}$ the thickness of the gate oxide film, $\phi_0$ temperature coefficient, $\Delta V_{th\tau}$ tolerant threshold voltage shift amount for the TFT, μ and σ mean value and standard deviation respectively of threshold voltage shift amounts of the plurality of TFTs manufactured under the prescribed manufacturing condition, m a constant, and β=1/α. The method includes the step of determining time coefficient α in expression (2a) based on the relation between threshold voltage shift amount $\Delta V_{th}$ obtained from at least one –BT stress test and time t; determining voltage coefficient d in expression (3a) based on the relation between gate voltage $V_G$ and the threshold voltage shift amount $\Delta V_{th}$ obtained from at least two –BT stress tests using different gate voltages $V_G$; the step of determining temperature coefficient $\phi_0$ in equation (4a) based on the relation between temperature T and the threshold voltage shift amount $\Delta V_{th}$ obtained from at least two –BT stress tests at different temperatures T; determining proportional constant $$\Delta V_{th0}\left(\frac{1}{t_0}\right)^\alpha \equiv C_2$$

in expression (5) obtained from the relation between expressions (2a), (3a) and (4a), by using determined time coefficient α, voltage coefficient d and temperature coefficient $\phi_0$; and calculating life τ of a single TFT manufactured under the aforementioned prescribed manufacturing condition, by using expression (8) which is obtained by substituting $\Delta V_{th\tau}/(1+m|\sigma/\mu|)$ for $\Delta V_{th\tau}$ in expression (7) for calculating life $\tau_0$ of the jumbo TFT, which expression is obtained by converting expression (5) based on the determined proportional constant $c_2$ and the tolerant threshold voltage shift amount $\Delta V_{th\tau}$ of the jumbo TFT.

A method of evaluating the reliability of a TFT according to a second aspect of the invention, in a TFT having a channel layer formed of a silicon thin film and a gate insulating film of silicon oxide film, evaluates the reliability of the TFT in the –BT stress state in which the gate is supplied with an arbitrary negative constant voltage $V_G$ and held at a predetermined constant temperature T based on the following expressions:

$$\Delta V_{th} \propto t^\alpha \tag{2a}$$

$$\Delta V_{th} \propto \exp\frac{qd|V_G|}{2kTt_{ox}} \tag{3a}$$

$$\Delta V_{th} = \Delta V_{th0}\left(\frac{t}{t_0}\right)^\alpha \exp\frac{qd|V_G|}{2kT_0t_{ox}} \tag{5b}$$

$$\tau_0 = t_0\left(\frac{\Delta V_{th\tau}}{\Delta V_{th0}}\right)^\beta \exp\left(-\frac{\beta qd|V_G|}{2kT_0t_{ox}}\right) \tag{7b}$$

$$\tau = t_0\left\{\frac{\Delta V_{th\tau}/(1-m|\sigma/\mu|)}{\Delta V_{th0}}\right\}^\beta \exp\left(-\frac{\beta qd|V_G|}{2kT_0t_{ox}}\right) \tag{8b}$$

where $\Delta V_{th}$ represents the threshold voltage shift amount of a jumbo TFT including a plurality of TFTs connected parallel to each other and manufactured under a prescribed manufacturing condition, t time, α time coefficient, q elementary electric charge, d voltage coefficient, k Boltzman constant, $t_{ox}$ the thickness of the gate oxide film, $\phi_0$ temperature coefficient, $\Delta V_{th\tau}$ tolerant threshold voltage shift amount for the TFT, μ and σ mean value and standard deviation, respectively, of the threshold voltage shift amounts of the plurality of TFTs manufactured under the aforementioned prescribed manufacturing condition, m a constant and β=1/α. The method includes the steps of determining time coefficient α in expression (2a) based on a relation between time t and threshold voltage shift amount $\Delta V_{th}$ obtained from at least one –BT stress test; determining voltage coefficient b in expression (3a) based on a relation between gate voltage $V_G$ and the threshold voltage shift amount $\Delta V_{th}$ obtained from at least two –BT stress test using different gate voltages; determining a proportional coefficient $$\Delta V_{th0}\left(\frac{1}{t_0}\right)^\alpha \equiv C_2$$

by using determined time coefficient α and voltage coefficient d in expression (5b) obtained from the relation between expressions (2a) and (3a); and calculating life τ of a single TFT manufactured under the aforementioned prescribed manufacturing condition by using an expression (8b) obtained by substituting $\Delta V_{th\tau}/(1+m|\sigma/\mu|)$ for $\Delta V_{th\tau}$ in expression (7) for calculating life $\tau_0$ of the jumbo TFT which expression is obtained by converting expression (5b) from the determined proportional coefficient $c_2$ and the tolerant threshold voltage shift amount $\Delta V_{th\tau}$ of the jumbo TFT.

A method evaluating reliability of a TFT in accordance with a third aspect of the present invention, in a TFT having a channel layer formed of polycrystalline silicon thin film and a gate insulating film of a silicon oxide film and manufactured under a prescribed manufacturing condition, evaluates the reliability of the TFT in the –BT stress state in which the gate is supplied with a predetermined negative constant voltage $V_G$ and maintained at an arbitrary constant temperature T using the following expressions:

$$\Delta V_{th} \propto t^\alpha \tag{2a}$$

-continued $$\Delta V_{th} \propto \exp\left(-\frac{q\phi_E}{kT}\right) \quad (4b)$$

$$\Delta V_{th} = \Delta V_{th0}\left(\frac{t}{t_0}\right)^\alpha \exp\left(-\frac{q\phi_E}{kT}\right) \quad (5c)$$

$$\tau_0 = t_0 \left(\frac{\Delta V_{th\tau}}{\Delta V_{th0}}\right)^\beta \exp\frac{\beta q\phi_E}{kT} \quad (7c)$$

$$\tau = t_0 \left\{\frac{\Delta V_{th\tau}/(1-m|\sigma/\mu|)}{\Delta V_{th0}}\right\}^\beta \exp\frac{\beta q\phi_E}{kT} \quad (8d)$$

where $\Delta V_{th}$ represents threshold voltage shift amount of a jumbo TFT including a plurality of TFTs connected parallel to each other and manufactured under a prescribed manufacturing condition, t time, $\alpha$ time coefficient, k Boltzman constant, $\phi_E$ temperature coefficient, $\Delta V_{th\tau}$ tolerant threshold voltage shift amount of the TFT, $\mu$ and $\sigma$ mean value and standard deviation, respectively, of threshold voltage shift amounts of the plurality of the TFTs manufactured under the aforementioned prescribed manufacturing condition, m a constant, and $\beta=1/\alpha$. The method includes the steps of determining time coefficient $\alpha$ in equation (2a) based on the relation between time t and threshold voltage shift amount $\Delta V_{th}$ obtained from at least one −BT stress test; determining temperature coefficient $\phi_E$ in expression (4b) based on the relation between temperature T and the threshold voltage shift amount $\Delta V_{th}$ obtained from at least two −BT stress tests at different temperatures T; determining proportional constant $$\Delta V_{th0}\left(\frac{1}{t_0}\right)^\alpha = C_2$$

using determined time coefficient $\alpha$ and temperature coefficient $\phi_E$ in expression (5c) obtained from the relation between expression (2a) and (4b); and calculating life $\tau$ of a single TFT manufactured under the aforementioned prescribed manufacturing condition by using expression (8d) obtained by substituting $\Delta V_{th\tau}/(1+m|\sigma/\mu|)$ for $\Delta V_{th\tau}$ with respect to (7c) for calculating life $\tau_0$ of jumbo TFT obtained by converting expression (5c) based on the determined proportional coefficient $c_2$ and tolerant threshold voltage shift amount $\Delta V_{th\tau}$ of the TFT.

A method of evaluating reliability of a TFT in accordance with a fourth aspect of the present invention, in a TFT having a channel layer of a polycrystalline silicon thin film and a gate insulating film of a silicon oxide film and manufactured under a prescribed manufacturing condition, estimates dangling bond density $N_{DB}$ and ratio of hydrogenation $P_H$ of silicon atoms in the silicon thin film utilizing −BT stress test in which the gate is supplied with a predetermined negative constant voltage $V_G$ and maintained at an arbitrary constant temperature T, using the following expressions:

$$\Delta V_{th} \propto t^\alpha \quad (2a)$$

$$\Delta V_{th} \propto \exp\frac{qd|V_G|}{2kTt_{ox}} \quad (3a)$$

$$\Delta V_{th} \propto \exp\left\{-\frac{q}{kT}\left(\phi_0 - \frac{d|V_G|}{2t_{ox}}\right)\right\} \quad (4a)$$

$$N_{DB} = \frac{|\Delta V_{thi}|}{m_1} + \frac{|V_{th0i}-V_{ths}|}{m_2} \quad (9)$$

$$P_H = \frac{1}{1+\frac{m_1}{m_2}\left|\frac{V_{th0i}-V_{ths}}{\Delta V_{thi}}\right|} \quad (10)$$

$$m_1 = \frac{q\xi}{C_{ox}}\left[1+\frac{2\int_0^{t_p}\int_{-\infty}^{+\infty}\{n_{db}(x,\epsilon-\phi(x,\Delta\phi_s))\cdot p_h(x,\epsilon-\phi(x,\Delta\phi_s))-n_{db}((x,\epsilon)\cdot p_h(x,\epsilon))\}\{1-f(\epsilon)\}\,d\epsilon\cdot dx}{\int_0^{t_p}\int_{-\infty}^{+\infty}n_{db}(x,\epsilon)\cdot p_h(x,\epsilon)\,d\epsilon\cdot dx}\right] \quad (11)$$

$$m_2 = \frac{\frac{2q}{C_{ox}}\int_0^{t_p}\int_{-\infty}^{+\infty}[n_{db}(x,\epsilon-\phi(x,\Delta\phi_s))\{1-p_h(x,\epsilon-\phi(x,\Delta\phi_s))\}-n_{db}(x,\epsilon)\{1-p_h(x,\epsilon)\}]\{1-f(\epsilon)\}\,d\epsilon\cdot dx}{\int_0^{t_p}\int_{-\infty}^{+\infty}n_{db}(x,\epsilon)\{1-p_h(x,\epsilon)\}\,d\epsilon\cdot dx} \quad (12)$$

$$\xi = \left(\frac{t}{t_s}\right)^\alpha \exp\left\{-\frac{q}{kT}\left(\phi_0-\frac{d|V_G|}{2t_{ox}}\right)\right\} \quad (13)$$

where $\Delta V_{th}$ represents threshold voltage shift amount of a jumbo TFT including a plurality of TFTs connected parallel to each other and manufactured under the prescribed manufacturing condition, t time, $\alpha$ time coefficient, q elementary electric charge, d voltage coefficient, k Boltzman constant, $t_{ox}$ thickness of the gate oxide film, $\phi_0$ time coefficient, $V_{th0i}$ and $\Delta V_{thi}$ initial threshold voltage and threshold voltage shift amount in a single TFT manufactured under the aforementioned prescribed manufacturing condition, $V_{ths}$ initial threshold voltage of an SOI-MOSFET having the same size and shape as the TFT, $m_1$ and $m_2$ proportional constants, $\zeta$ degree of dissociation of Si-H coupling, $C_{ox}$ capacitance of gate insulating film, $n_{db}(x,\epsilon)$ and $P_h(x,\epsilon)$ dangling bond density and ratio of hydrogenation, respectively, per unit energy and per unit volume at a position having energy potential $\epsilon$ with reference to an intrinsic Fermi level at a depth x from the surface of the channel layer, $f(\epsilon)$ Fermi distribution function, $\phi(x, \phi_s)$ potential at position x when surface potential is $\phi_s$, $t_p$ thickness of the polycrystalline silicon thin film, $\Delta\phi_s$ amount of change in surface potential of the TFT reaching the threshold voltage condition from flat band condition, and $t_s$ a constant. The method includes the steps of determining time coefficient $\alpha$ in expression (2a) based on the relation between time t and the threshold voltage shift amount $\Delta V_{th}$ obtained from at least one −BT stress test; determining voltage coefficient d in expression (3a) based on the relation between gate voltage $V_G$ and threshold voltage shift amount $\Delta V_{th}$ obtained from at least two −BT stress tests using different gate voltages $V_G$; determining temperature coefficient $\phi_0$ in equation (4a) based on the relation between temperature T and threshold voltage shift amount $\Delta V_{th}$ obtained from at least two −BT stress tests at different temperatures T; and calculating dangling bond density $N_{DB}$ and ratio of hydrogenation $P_H$ from expressions (9) to (13) using the determined time coefficient $\alpha$, voltage coefficient d and temperature coefficient $\phi_0$.

In the method of evaluating reliability of the TFT in accordance with a first aspect of the present invention, estimated life is evaluated by using time coefficient $\alpha$, voltage coefficient d and temperature coefficient $\phi_0$ determined from expressions (2a), (3a) and (4a) and −BT stress test and using expression (8) using mean value $\mu$ and standard deviation $\sigma$ of the threshold voltages of the plurality of TFTs, predicted life of a single TFT used with an arbitrary constant gate voltage $V_G$ at an arbitrary constant temperature T can be easily evaluated with high reliability.

In the method of evaluating reliability of the TFT in accordance with the second aspect of the present invention, it is limited that TFT is used at a predetermined constant temperature. Therefore, predicted life of a single TFT can be evaluated without necessitating at least two −BT stress tests at different temperatures T.

In the method of evaluating reliability of the TFT in accordance with the third aspect of the present invention, it is limited that the TFT is used with a predetermined constant gate voltage $V_G$, and therefore predicted life of a single TFT can be evaluated without necessitating at least two −BT stress tests using different gate voltages $V_G$.

In the method of evaluating reliability of the TFT in accordance with the fourth aspect of the invention, dangling bond density and ratio of hydrogenation are calculated in accordance with expressions (9) to (13) using time coefficient $\alpha$, voltage coefficient d and temperature coefficient $\phi_0$ determined from expressions (2a), (3a) and (4a) and −BT stress test, and therefore dangling bond density and the ratio of hydrogenation in a polycrystalline silicon thin film after an arbitrary −BT stress test of a single TFT can be readily evaluated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a graph showing relation between threshold voltage shift amount and the gate voltage in a −BT stress test.

FIG. 14 is an equivalent circuit diagram showing an example of SRAM cell.

FIG. 15 is an illustration showing −BT stress state of a TFT in an SRAM cell.

DESCRIPTION OF THE PREFERRED EMBODIMENTS

Figure 1:
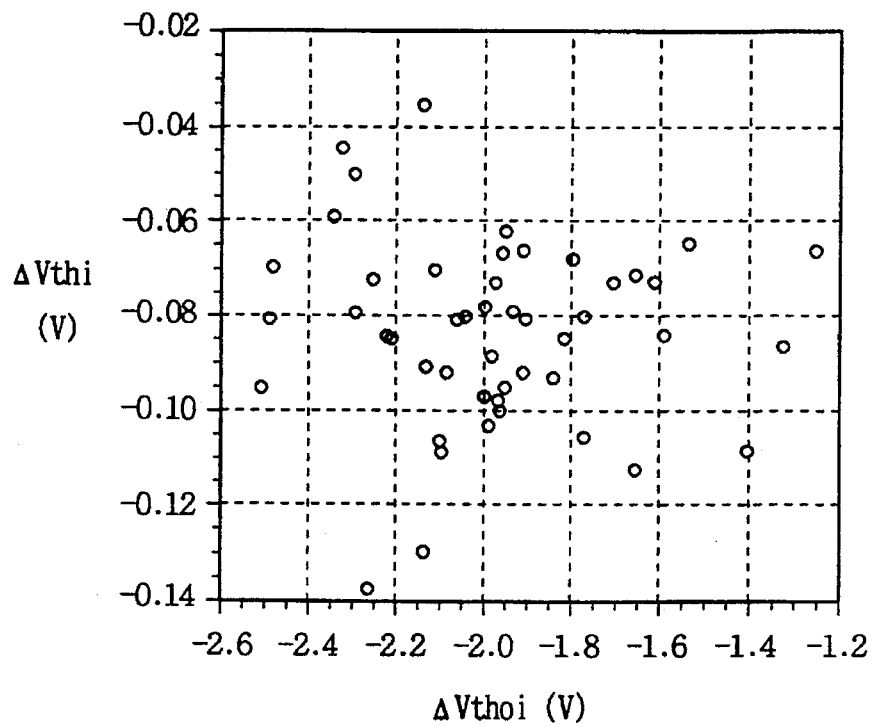
FIG. 1 is a graph showing relation between variation in initial threshold voltage $V_{th0i}$ and variation in threshold voltage shift amount $\Delta V_{thi}$ caused by −BT stress in a plurality of TFTs manufactured under the same manufacturing condition.

FIG. 1 is a graph showing a relation between variation in initial threshold voltage $V_{th0i}$ and threshold voltage shift amount $\Delta V_{thi}$ caused by −BT stress among a plurality of TFTs manufactured under the same manufacturing condition. As is apparent from the graph, there is not an explicit correlation between the variation in the initial threshold voltage $V_{th0i}$ and the variation in the threshold voltage shift amount $\Delta V_{thi}$ after −BT stress test. This is an important fact revealed for the first time through the experiments by the inventors.

If there is a relation that the higher the initial threshold voltage $V_{th0i}$ of a TFT, the larger the threshold voltage shift amount $\Delta V_{thi}$ results after −BT stress, it would be necessary to investigate an SRAM cell including that TFT which has the highest initial threshold voltage $V_{th0i}$, so as to ensure hold lower limit for holding data for a long period of time. However, there is not any correlation between the variation in the initial threshold voltage $V_{th0i}$ and the variation of the threshold voltage shift amount $\Delta V_{thi}$ after −BT stress test. Thus, the inventors have found that what is necessary is to ensure hold lower limit without the necessity of considering initial threshold voltage $V_{th0i}$, simply by studying mean value $\mu$ and standard deviation $\sigma$ indicating variation, of the threshold voltage shift amount $\Delta V_{thi}$ after −BT stress test.

In the following, the method of evaluating reliability of an individual TFT among a plurality of TFTs manufactured under a prescribed manufacturing condition utilizing −BT stress test will be described.

Figure 2:
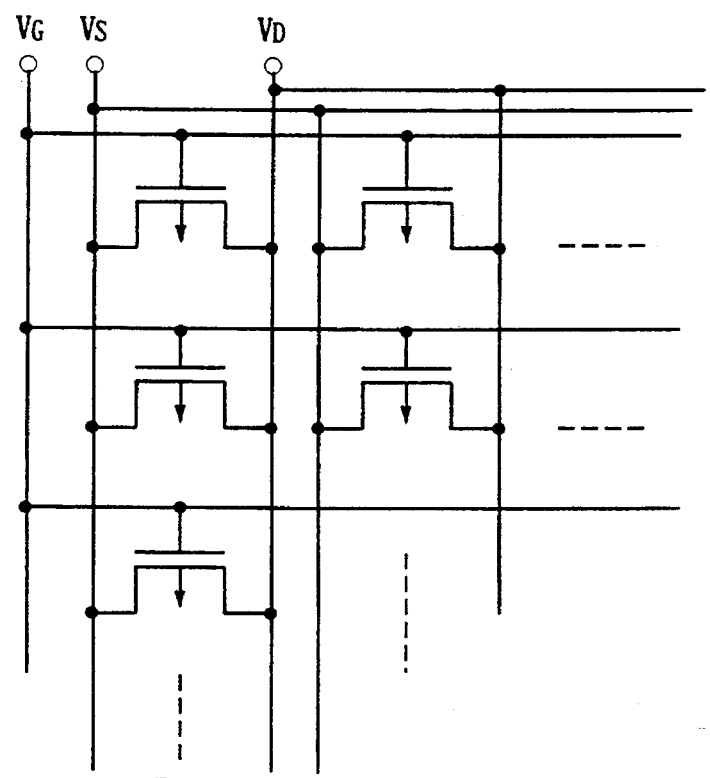
FIG. 2 is an equivalent circuit diagram showing a jumbo TFT including a plurality of TFTs connected parallel to each other and manufactured under the same manufacturing condition.

Referring to FIG. 2, a jumbo TFT including a plurality of TFTs connected parallel to each other and manufactured under the same manufacturing condition is prepared. The shift amount $\Delta V_{th}$ of the threshold voltage $V_{th}$ when the jumbo TFT is held at an absolute temperature T with a gate voltage $V_G$ for a time period t is represented by the following expression (1):

$$\Delta V_{th} \propto t^\alpha \exp\left\{ -\frac{q}{kT}\left(\phi_0 - \frac{d|V_G|}{2t_{ox}}\right) \right\} \quad (1)$$

where $\alpha$ represents time coefficient, $\phi_0$ temperature coefficient, d voltage coefficient, k Boltzman constant, q elementary electric charge and $t_{ox}$ thickness of the gate insulating film.

The method of predicting the threshold voltage shift amount $\Delta V_{th}$ of the jumbo TFT caused by −BT stress test using the expression (1) above will be described in the following.

First, the temperature of the jumbo TFT is set, for example, to 125° C. which is the temperature at the −BT stress state. $I_D$-$V_G$ characteristic is measured at that temperature, and the threshold voltage Vth of jumbo TFT is calculated. The threshold voltage at this time is referred to as initial threshold voltage $V_{th0}$. Then, at the temperature T=125° C., source voltage $V_S$ and drain voltage $V_D$ are set to 0 V, and a negative voltage, for example, of −7 V is applied as the gate voltage $V_G$. This state is referred to as −BT stress state, and the time at which application of the gate voltage starts is set to t=0.

After the lapse of a prescribed time period t, −BT stress state is released, and the threshold voltage at time t, that is, $V_{th}(t)$ is measured. As soon as the measurement of threshold voltage $V_{th}(t)$ is finished, jumbo TFT is returned to −BT stress state. By repeating measurement of the threshold voltage $V_{th}(t)$, a graph such as shown in FIG. 3 can be obtained.

Figure 3:
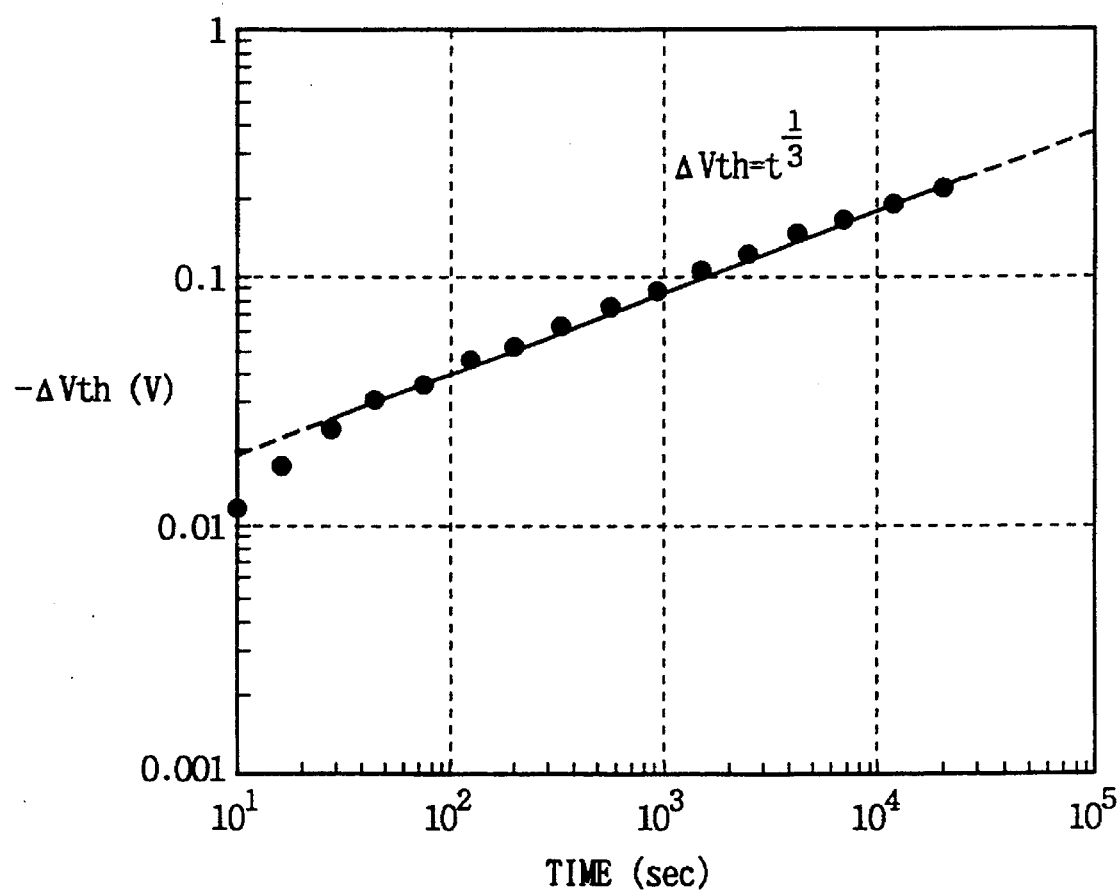
FIG. 3 is a graph showing relation between threshold voltage shift amount and time under −BT stress.

Referring to FIG. 3, the abscissa represents time (sec) while the ordinate represents the threshold voltage shift amount $-\Delta V_{th}(V)$. Here, the threshold voltage shift amount satisfies the relation $\Delta V_{th}=V_{th}(t)-V_{th0}$. Based on the graph of FIG. 3, time coefficient $\alpha$ in the following expression (2) can be determined.

$$\Delta V_{th} = V_1 t^\alpha \quad (2)$$

where $V_1$ is proportional constant. The time coefficient $\alpha$ can be determined with higher accuracy as −BT stress time becomes longer. In the example shown in FIG. 3, the coefficient $\alpha=\frac{1}{3}$ is obtained. Hereinafter, the process for calculating the time coefficient $\alpha$ will be referred to as process A.

Thereafter, in a jumbo TFT manufactured under the same condition, a −BT stress test is performed in which gate voltage different from that in process A. For example $V_G$ is set to $V_G=12$ V, while the temperature is set to T=125° C., which is the same as that in process A. In accordance with the steps described in process A, the shift amount $\Delta V_{th}$ of the threshold voltage $V_{th}$ is measured.

FIG. 4 is a graph showing the result of a plurality of −BT stress test using different gate voltages $V_G$. The abscissa represents gate voltage $V_G(V)$, and the ordinate represents the threshold voltage shift amount $-\Delta V_{th}(V)$. The left circle in the graph represents the result of test where $V_G$ was $V_G=7$ V and the temperature was T=125° C., while the right circle represents the result of test where $V_G$ was $V_G=12$ V and the temperature was T=125° C. Both of the test results indicate the states after the lapse of the same period of time $t=t_0$ after the start of the test. In the example of FIG. 4, the result when $t_0=10^4$ sec is shown. Based on this graph, the voltage coefficient d=3.8 Å can be obtained in the following equation (3), where $V_2$ represents proportional constant:

$$\Delta V_{th}(t_0) = V_2 \exp\frac{qd|V_G|}{2kTt_{ox}} \quad (3)$$

Though gate voltages $V_G$ of −V and −12 V were used in FIG. 4, the value of the voltage coefficient d can be calculated with higher precision through larger number of test using larger number of different gate voltages $V_G$. In the plurality of tests for calculating the voltage coefficient d, the temperature used for the test must be constant. However, it may not be the same temperature as used in process A.

Hereinafter, the steps for calculating the voltage coefficient d will be referred to as process B. In expression (3) in process B, $|V_G|/t_{ox}$ represents electric field, and therefore the voltage coefficient d may be considered as electric field coefficient. Alternatively $d'=qd/2k$ may be considered as an electric field coefficient.

Further, in a jumbo TFT manufactured under the same manufacturing condition, −BT stress test is performed at a temperature different from that in the process A. For example, the temperature T=25° C. is used, and the gate voltage is set to the same value of $V_G=-7$ V as in process A. Under such condition, time change of the threshold voltage shift amount $\Delta V_{th}$ is measured through the same steps as described in process A.

Figure 5:
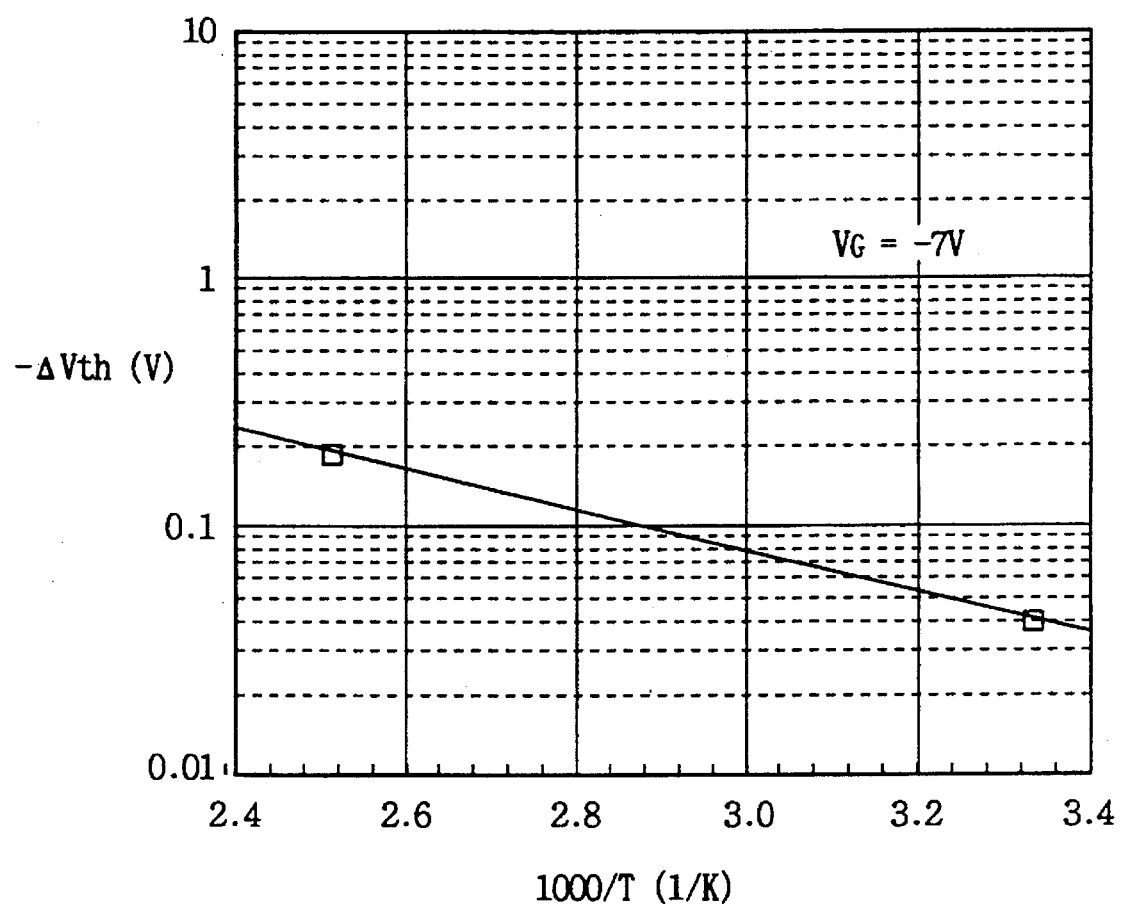
FIG. 5 is a graph showing relation between threshold voltage shift amount and temperature in a −BT stress test.

FIG. 5 is a graph showing the result of measurement when T was T=125° C. and $V_G$ was $V_G=-7$ V and the result of measurement when the temperature was T=25° C. and $V_G$ was $V_G=7$ V. In this graph, the abscissa represents reciprocal number 1000/T (1/K) of temperature, while the ordinate represents the threshold voltage shift amount $-\Delta V_{th}(V)$. In the graph of FIG. 5 also, the results shown are the states after the lapse of time $t_0=10^4$ sec after the start of the test. The square on the left shows the result when T=125° C. and $V_G=7$ V, and the square on the right represents the result when T=25° C. and $V_G=-7$ V. Based on the voltage coefficient d obtained through process B and from FIG. 5, the temperature coefficient $\phi_0$ in the following expression (4) can be obtained.

$$\Delta V_{th}(t_0) = \Delta V_{th0} \exp\left\{ -\frac{q}{kT}\left(\phi_0 - \frac{d|V_G|}{2t_{ox}}\right) \right\} \quad (4)$$

In the example of FIG. 5, $q\phi_0=0.23$ eV can be obtained. Hereinafter, the steps for calculating the temperature coefficient $\phi_0$ will be referred to as process C.

In process C also, the value of temperature coefficient $\phi_0$ can be calculated with higher accuracy through larger number of tests with various different temperature conditions. In the plurality of tests in process C, the test may be carried out using a gate voltage different from that in process A, provided that the gate voltage is constant.

The threshold voltage shift amount $\Delta V_{th}$ called by −BT stress in the jumbo TFT can be predicted in accordance with the expression (5) below through the above described three processes A, B and C:

$$\Delta V_{th} = \Delta V_{th0} \left( \frac{t}{t_0} \right)^\alpha \exp \left\{ -\frac{q}{kT} \left( \phi_0 - \frac{d|V_G|}{2t_{ox}} \right) \right\} \quad (5)$$

where $t_0$ is $10^4$ sec in the above examples. However, it goes without saying that any other appropriate time can be set as the time $t_0$. Further, even when the value of $t_0$ differ in processes B and C, the threshold voltage shift amount $\Delta V_{th}$ can be calculated, as the time coefficient $\alpha$ is known.

Further, processes A, B and C may be performed in an arbitrary order. In the example above, the voltage coefficient d calculated through process B is utilized in process C. However, if the process C is performed earlier, the value $\phi_e$ defined by the following expression (6).

$$\phi_E \equiv \phi_0 - \frac{d|V_G|}{2t_{ox}} \quad (6)$$

is calculated first, and then $\phi_e$ may be converted to $\phi_0$ utilizing the voltage coefficient d calculated through process B.

By using expression (5), the threshold voltage shift amount $\Delta V_{th}$ after the lapse of a certain time period t under −BT stress state can be predicted. Alternatively, the time $\tau_0$ (life of jumbo TFT) until the threshold voltage shift amount $\Delta V_{th}$ reaches a certain tolerant value $\Delta V_{th\tau}$ can be obtained. When expression (5) is solved by substituting $\Delta V_{th} = \Delta V_{th\tau}$ and $t=\tau_0$, the following expression (7) is obtained.

$$\tau_0 = t_0 \left( \frac{\Delta V_{th\tau}}{\Delta V_{th0}} \right)^\beta \exp \frac{\beta q \phi_0}{kT} \exp \left( -\frac{\beta q d |V_G|}{2kTt_{ox}} \right) \quad (7)$$

where $\beta=1/\alpha$. In other words, by inputting the tolerant threshold voltage shift amount $\Delta V_{th\tau}$ within which the jumbo TFT does not suffer from any functional problem, the gate voltage $V_G$ used and the value of temperature T to expression (7), the life $\tau_0$ of the jumbo TFT under −BT stress can be obtained.

Then, for an individual TFT among a plurality of TFTs manufactured under the same manufacturing condition as the plurality of TFTs in the jumbo TFT is subjected to −BT stress test. In this −BT stress test, the temperature, voltage, and the stress time may be set to such values that allow precise measurement of the threshold voltage shift amount $\Delta V_{thi}$ of the individual TFT. The threshold voltage shift amount $\Delta V_{thi}$ of the individual TFT is calculated from the difference in the threshold voltages before and after −BT stress test.

When we represent the number of individual TFTs used for measuring the threshold voltage shift amount $\Delta V_{thi}$ by n, the mean value $\mu$ and the standard deviation $\sigma$ indicating the degree of variation of the threshold voltage shift amount $\Delta V_{thi}$ can be calculated in accordance with the following expressions.

$$\mu = \frac{1}{n} \sum_{i=1}^{n} \Delta V_{thi}$$

$$\sigma = \sqrt{\frac{\sum_{i=1}^{n} (\Delta V_{thi} - \mu)^2}{n-1}}$$

Therefore, the life $\tau$ of the individual TFT taking into consideration the variation of threshold voltage shift amount $\Delta V_{thi}$ can be calculated by using the expression (8), in which $\Delta V_{th\tau}/(1+m|\sigma/\mu|)$ substitutes for $\Delta V_{th\tau}$ in expression (7):

$$\tau = t_0 \left\{ \frac{\Delta V_{th\tau}(1 - m|\sigma/\mu|)}{\Delta V_{th0}} \right\}^\beta \exp \frac{\beta q \phi_0}{kT} \exp \left( -\frac{\beta q d |V_G|}{2kTt_{ox}} \right) \quad (8)$$

where m is a factor designating strictness of the evaluation of the individual TFT, and a value around 3 may be used for m.

More specifically, the mean value $\mu$ and the standard deviation $\sigma$ are calculated from the data obtained through measurement of variation in threshold voltage shift amount $\Delta V_{thi}$ in the individual TFTs shown in FIG. 1, and when these values are input to expression (8), the life of the SRAM device in consideration with the variation of TFT characteristics in the SRAM device can be obtained. Therefore, an SRAM device which is free from hold defect even after holding data for a long period of time can be obtained.

The method of evaluation of reliability described above may be also applied to a single crystal MOSFET.

Figure 6:
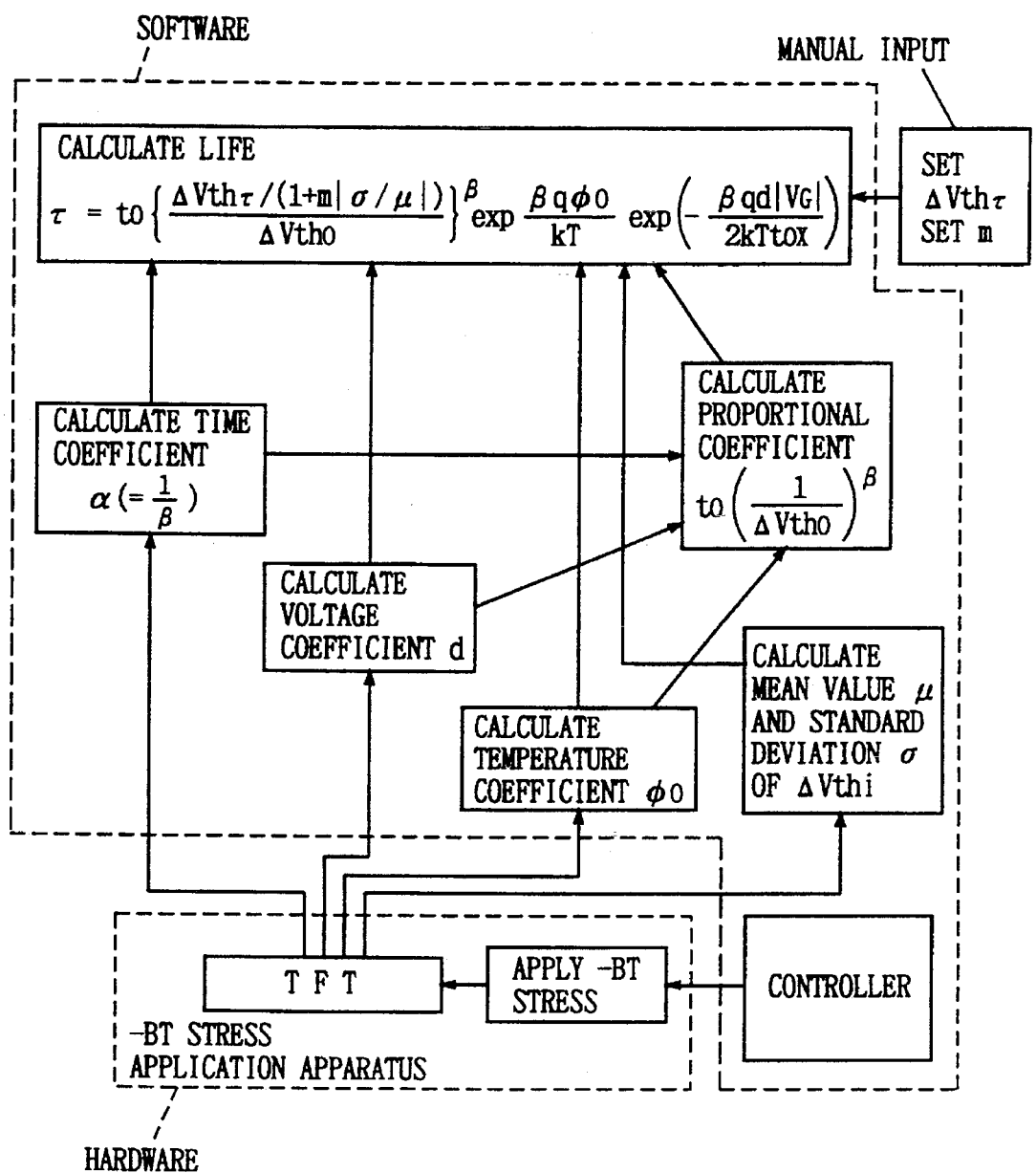
FIG. 6 is a flow chart showing the steps of the method of evaluating the TFT utilizing expression (8).

FIG. 6 is a flow chart showing the steps of the method of evaluating reliability of an individual TFT in accordance with the expression (8) above. This figure may help visual understanding of the steps in the method of evaluating reliability of an individual TFT utilizing the expression (8).

An example of a modification of the above-described method of evaluating reliability will be described. When time coefficient $\alpha$, voltage coefficient d, temperature coefficient $\phi_0$ and proportional constant $$t_0 \left( \frac{1}{\Delta V_{th0}} \right)^\beta \equiv c_1$$

related to the life of jumbo TFT (a) manufactured under a first manufacturing condition have been already calculated, life of a jumbo TFT (b) manufactured under a second manufacturing condition can be estimated in the following manner.

At least one −BT stress test is performed on the jumbo TFT (b), and the threshold voltage shift amount $\Delta V_{thb}$ at a certain time $t_0$ is obtained. The threshold voltage shift amount $\Delta V_{tha}$ of the jumbo TFT (a) under the same condition is also calculated. Since expression (5) has been determined with respect to jumbo TFT (a), the value $\Delta V_{tha}$ may be calculated through expression (5), or it may be calculated by actual measurement.

When the value $\Delta V_{thb}$ and the value $\Delta V_{tha}$ under the same condition are calculated, the threshold voltage shift amount and the life under an arbitrary condition of jumbo TFT (b) can be expressed as the following expressions (5a) and (7a) using the ratio of calculated values $\Delta V_{thb}$ and $\Delta V_{tha}$. Here, it should be noted that the coefficient $\beta(=1/\alpha)$, d and $\phi_0$ used in expressions (5a) and (7a) are values related to jumbo TFT (a).

$$\Delta V_{th} = \Delta V_{th0} \frac{\Delta V_{thb}}{\Delta V_{tha}} \left( \frac{t}{t_0} \right)^\alpha \exp \left\{ -\frac{q}{kT} \left( \phi_0 - \frac{d|V_G|}{2t_{ox}} \right) \right\} \quad (5a)$$

$$\tau_0 = t_0 \left( \frac{\Delta V_{th\tau}}{\Delta V_{th0} \frac{\Delta V_{thb}}{\Delta V_{tha}}} \right)^\beta \exp \frac{\beta q \phi_0}{kT} \exp \left( -\frac{\beta q d |V_G|}{2kTt_{ox}} \right) \quad (7a)$$

Since coefficients $\beta$, d and $\phi_0$ depend on the method of manufacturing the TFT, the life of the jumbo TFT (b) cannot be accurately estimated if jumbo TFT (a) is manufactured through considerably different steps of manufacturing the jumbo TFT (b). However, if the manufacturing method is not much different, the life of jumbo TFT (b) can be easily estimated from expression (7a), utilizing the expressions calculated for jumbo TFT (a). Since the time coefficient $\beta$ can be obtained through one −BT stress test, more accurate life $\tau_0$ of jumbo TFT (b) can be estimated when the time coefficient $\beta$ of jumbo TFT (b) itself is used in expression (7a).

Figure 10:
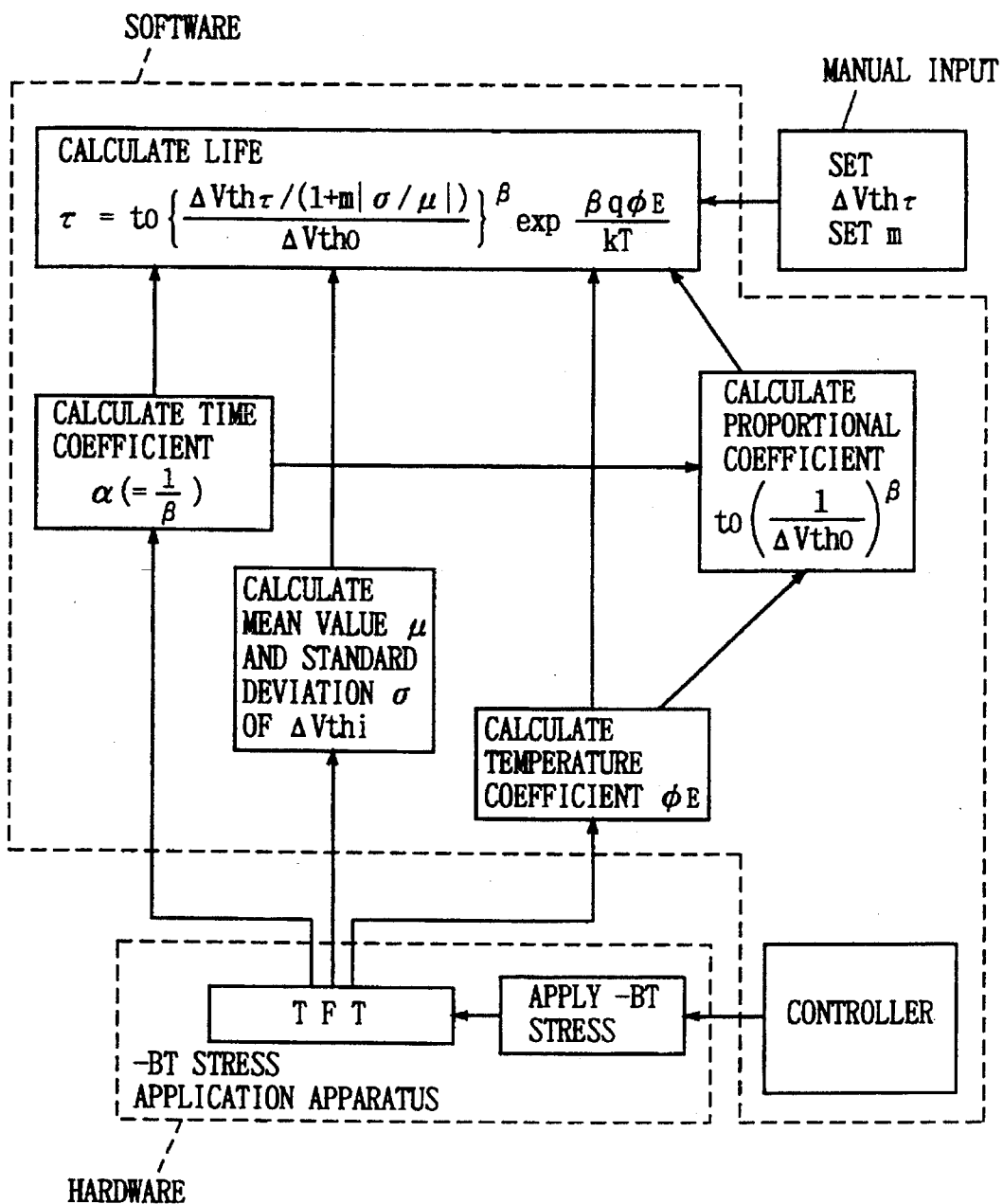
FIG. 10 is a flow chart showing the steps of the method of evaluating reliability of a TFT which is not used with a voltage other than a predetermined gate voltage.

As in the embodiment of FIG. 10, by using the following expression (8a) in which $\Delta V_{th\tau}/(1+|\sigma/\mu|)$ substitutes for $\Delta V_{th\tau}$ in expression (7a), life $\tau$ of an individual TFT (b) manufactured under the second manufacturing condition can be estimated:

$$\tau = t_0 \left\{ \frac{\Delta V_{th\tau}/(1 - m|\sigma/\mu|)}{\Delta V_{th0} \cdot \Delta V_{thb}/\Delta V_{tha}} \right\}^\beta \exp\frac{\beta q \phi_0}{kT} \exp\left(-\frac{\beta q d|V_G|}{2kTt_{ox}}\right) \quad (8a)$$

At this time, the mean value $\mu$ and the standard deviation $\sigma$ of the threshold voltage shift amount $\Delta V_{thi}$ of the individual TFT may be calculated by using an individual TFT (a), or they may be calculated by using an individual TFT (b). More specifically, when the mean value $\mu$ and standard deviation $\sigma$ of $\Delta V_{thi}$ has been already calculated for TFT (a), then there is an advantage that the life of individual TFT (b) can be determined simply by performing one −BT stress test for jumbo TFT (b). Meanwhile, if the values $\mu$ and $\sigma$ are calculated by using the individual TFT (b), the life of the individual TFT (b) can be determined with higher precision, as the information with respect to variation of TFT characteristic is obtained from the plurality of TFTs (b) themselves.

Figure 7:
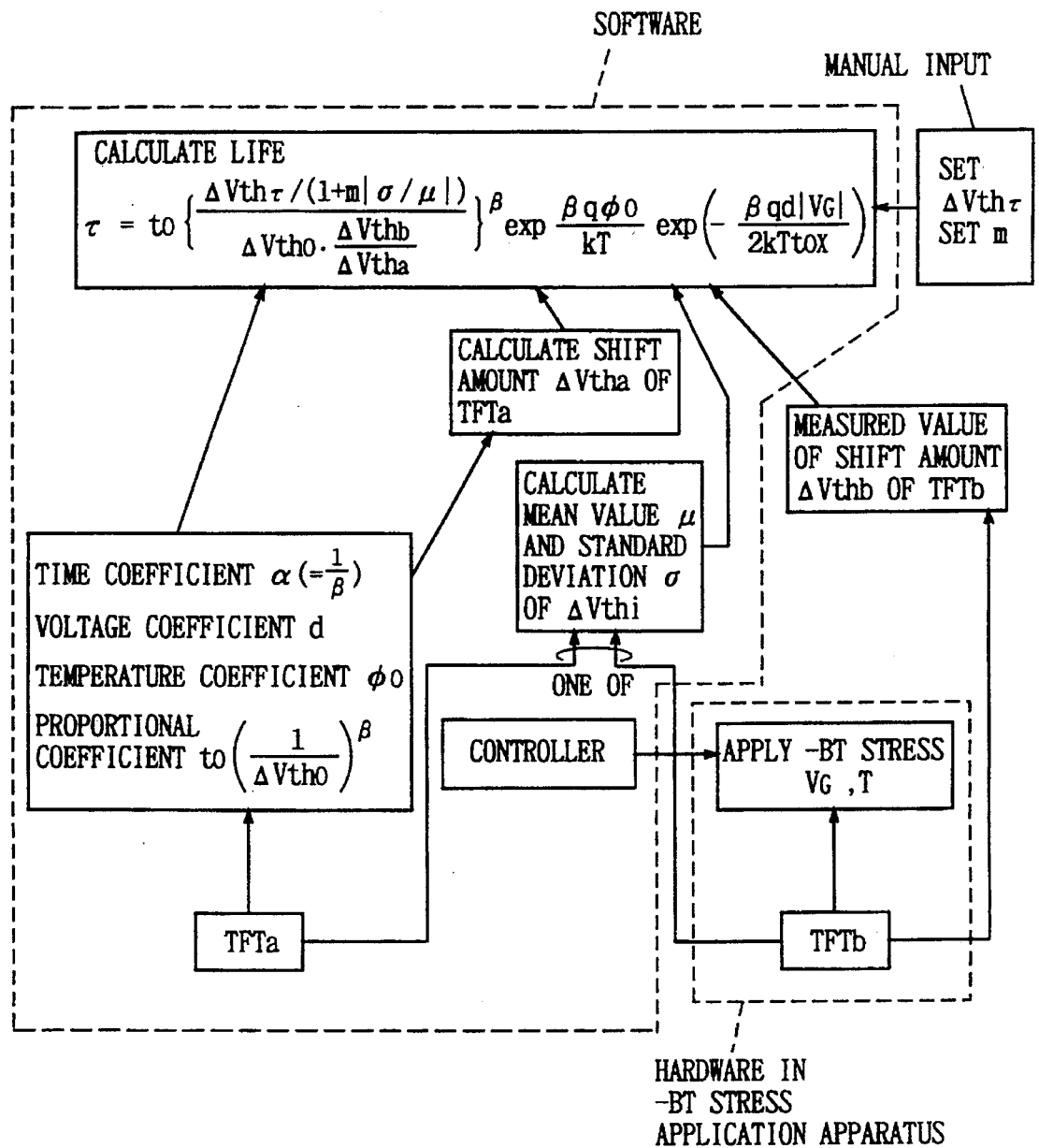
FIG. 7 is a flow chart showing steps for performing evaluation of the reliability of other TFTs easily, by utilizing result of the method of evaluating reliability shown in FIG. 6.

FIG. 7 is a flow chart illustrating the method of estimating life of an individual TFT easily by using expression (8a). This figure may help visual understanding of the method of estimating life of the individual TFT (b) manufactured under the second manufacturing condition, easily by utilizing the result of −BT stress test with respect to a TFT (a) manufactured under the first manufacturing condition.

If it is not necessary to predict life of the TFT at a temperature other than the predetermined temperature $T_0$, it is not necessary to calculate temperature coefficient $\phi_0$ through process C described above. At this time, the threshold voltage shift amount $\Delta V_{th}$ and life $\tau_0$ of the jumbo TFT can be calculated through expressions (5b) and (7b) below, while the life $\tau$ of the individual TFT can be calculated through the expression (8b):

$$\Delta V_{th} = \Delta V_{th0} \left(\frac{t}{t_0}\right)^\alpha \exp\frac{q d|V_G|}{2kT_0 t_{ox}} \quad (5b)$$

$$\tau_0 = t_0 \left(\frac{\Delta V_{th\tau}}{\Delta V_{th0}}\right)^\beta \exp\left(-\frac{\beta q d|V_G|}{2kT_0 t_{ox}}\right) \quad (7b)$$

$$\tau = t_0 \left\{ \frac{\Delta V_{th\tau}/(1 - m|\sigma/\mu|)}{\Delta V_{th0}} \right\}^\beta \exp\left(-\frac{\beta q d|V_G|}{2kT_0 t_{ox}}\right) \quad (8b)$$

Figure 8:
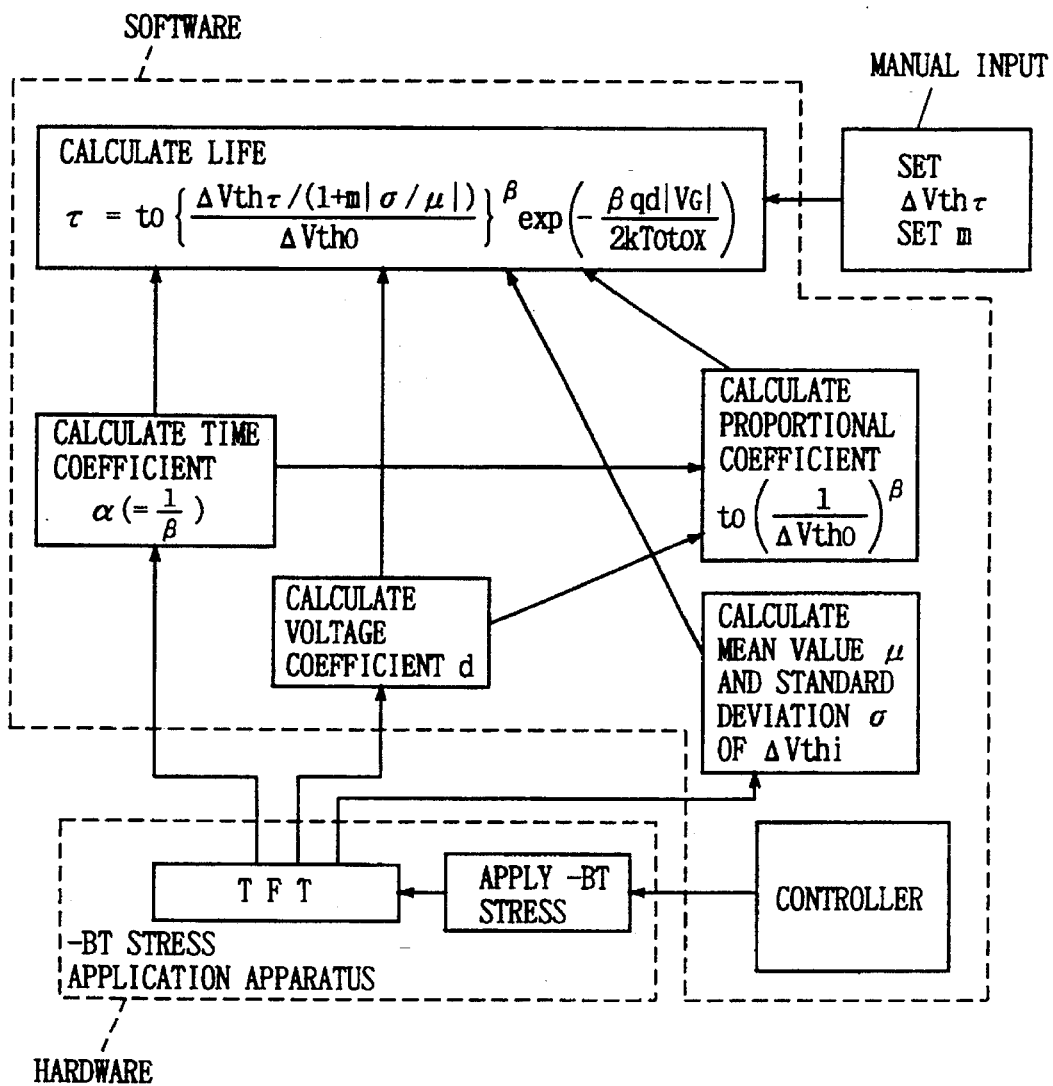
FIG. 8 is a flow chart showing the steps of the method for evaluating reliability of the TFT which is used only at a predetermined temperature.

The steps for predicting life of an individual TFT utilizing the expression (8b) is illustrated in the flow of FIG. 8.

Figure 9:
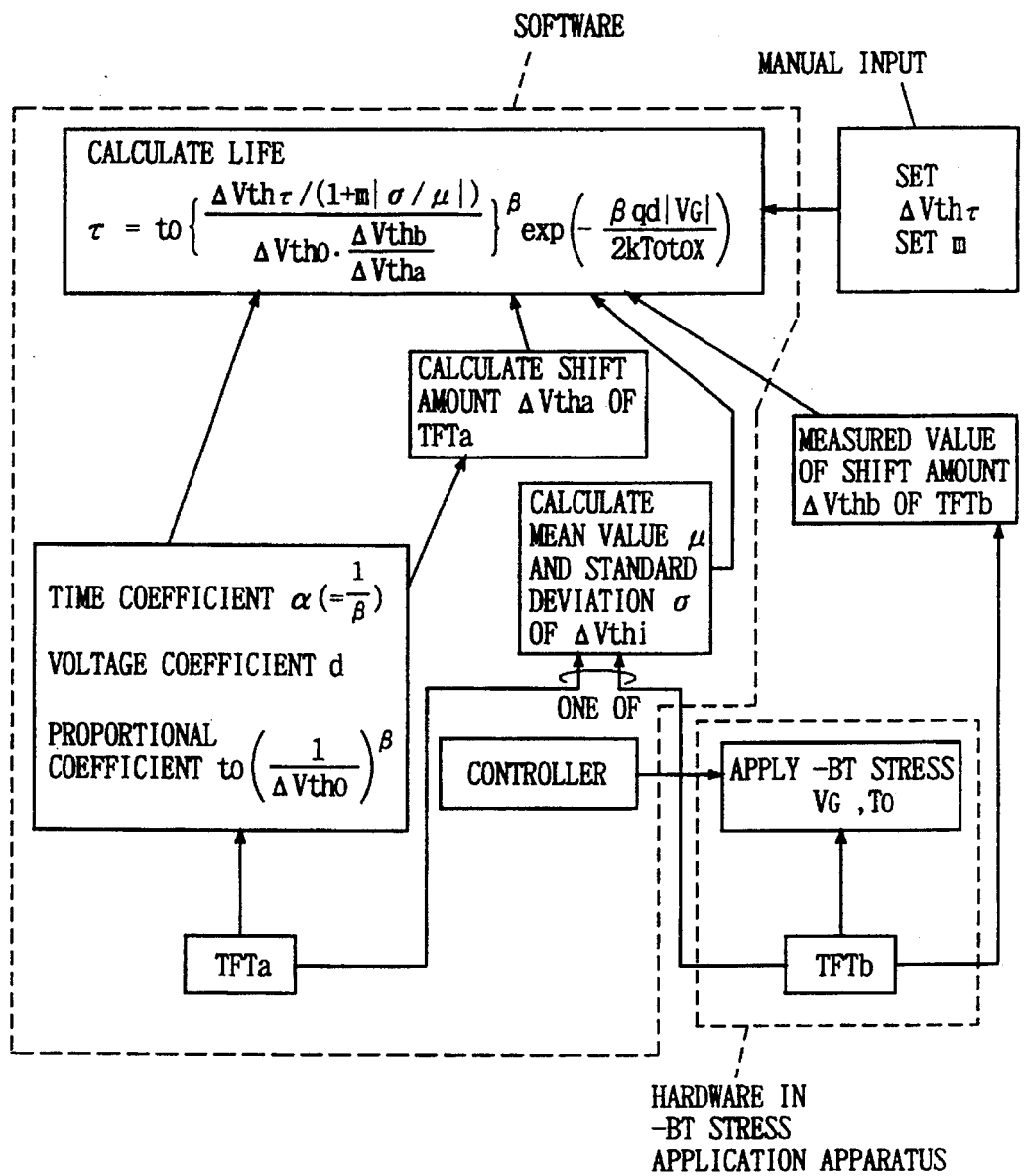
FIG. 9 is a flow chart showing the steps of evaluating reliability of other TFTs easily, by utilizing the result obtained by the method of evaluating reliability shown in FIG. 8.

FIG. 9 is a flow chart showing the steps of the method of predicting life of another individual TFT (b), utilizing the result with respect to a TFT (a) obtained through the steps of FIG. 8. More specifically, by using the threshold voltage shift amounts $\Delta V_{tha}$ and $\Delta V_{thb}$ of jumbo TFT (a) and jumbo TFT (b) under the same condition, the life $\tau_0$ of jumbo TFT (b) can be calculated by replacing $\Delta V_{th0}$ by $\Delta V_{th0} \Delta V_{thb}/\Delta V_{tha}$ in expression (7b), while the life $\tau$ of the individual TFT (b) can be calculated through the expression (8c):

$$\tau = t_0 \left\{ \frac{\Delta V_{th\tau}/(1 - m|\sigma/\mu|)}{\Delta V_{th0} \cdot \Delta V_{thb}/\Delta V_{tha}} \right\}^\beta \exp\left(-\frac{\beta q d|V_G|}{2kT_0 t_{ox}}\right) \quad (8c)$$

Further, if it is not necessary to predict life of the TFT at a voltage other than the predetermined gate voltage $V_{G0}$, it is not necessary to calculate the voltage coefficient d through the above described process B. At that time, the threshold voltage shift amount $\Delta V_{th}$ and life $\tau_0$ of the jumbo TFT can be calculated in accordance with the expressions (5c) and (7c) below, while the life $\tau$ of the individual TFT can be calculated through the expression (8d).

$$\Delta V_{th} = \Delta V_{th0} \left(\frac{t}{t_0}\right)^\alpha \exp\left(-\frac{q\phi_E}{kT}\right) \quad (5c)$$

$$\tau_0 = t_0 \left(\frac{\Delta V_{th\tau}}{\Delta V_{th0}}\right)^\beta \exp\frac{\beta q\phi_E}{kT} \quad (7c)$$

$$\tau = t_0 \left\{ \frac{\Delta V_{th\tau}/(1 - m|\sigma/\mu|)}{\Delta V_{th0}} \right\}^\beta \exp\frac{\beta q\phi_E}{kT} \quad (8d)$$

The steps in the method of evaluating reliability of an individual TFT when it is not necessary to calculate voltage coefficient d is illustrated in the flow chart of FIG. 10.

Figure 11:
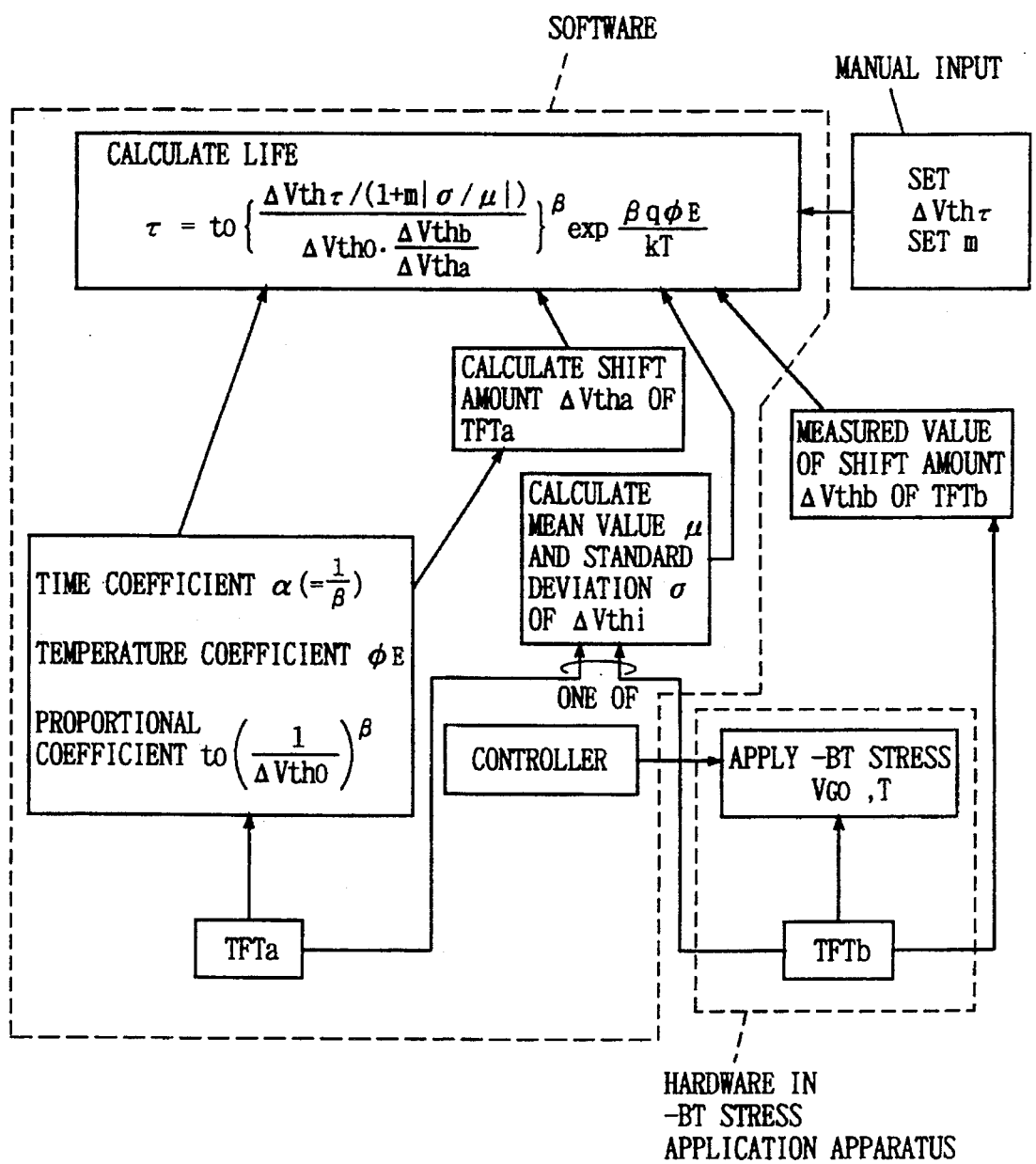
FIG. 11 is a flow chart showing the steps of evaluating reliability of other TFTs easily, by utilizing the result obtained by the method of evaluating reliability shown in FIG. 10.

FIG. 11 is a flow chart showing the steps of a method easily predicting life of another TFT (b) utilizing the results for a TFT (a) obtained through the steps of FIG. 10. More specifically, by using threshold voltage shift amount $\Delta V_{tha}$ and $\Delta V_{thb}$ of jumbo TFT (a) and jumbo TFT (b) under the same condition, the life $\tau_0$ of jumbo TFT (b) can be calculated by replacing $\Delta V_{th0}$ by $\Delta V_{th0} \cdot \Delta V_{thb}/\Delta V_{tha}$ in expression (7c), and life $\tau$ of the individual TFT (b) can be calculated by the following expression (8e).

$$\tau = t_0 \left\{ \frac{\Delta V_{th\tau}/(1 - m|\sigma/\mu|)}{\Delta V_{th0} \cdot \Delta V_{thb}/\Delta V_{tha}} \right\}^\beta \exp\frac{\beta q\phi_E}{kT} \quad (8e)$$

Now, reliability of the TFT has close relation between the dangling bond density and the ratio of hydrogenation in the channel layer formed of polycrystalline silicon thin film, as already described. Therefore, a method of estimating the dangling bond density and the ratio of hydrogenation in an individual TFT utilizing −BT stress test will be described in the following.

The dangling bond density $N_{DB}$ and the ratio of hydrogenation $P_H$ in the TFT are represented by the expressions (9) and (10) respectively.

$$N_{DB} = \frac{|\Delta V_{thi}|}{m_1} + \frac{|V_{th0i} - V_{ths}|}{m_2} \quad (9)$$

$$P_H = \frac{1}{1 + \frac{m_1}{m_2}\left|\frac{V_{th0i} - V_{ths}}{\Delta V_{thi}}\right|} \quad (10)$$

where $m_1$ and $m_2$ are proportional constants and $V_{ths}$ represents threshold voltage of an SOI (Silicon On Insulator) type MOSFET (Metal Oxide Semiconductor Field Effect Transistor) having the same size and shape as the TFT.

Since the channel layer of the SOI-MOSFET is formed of a single crystal silicon, the threshold voltage $V_{ths}$ can be calculated by known method separately. The threshold voltage $V_{ths}$ obtained by the calculation can be corrected to more accurate value by using result of experiments on a capacitor having a capacitor insulating film manufactured under the same condition as the gate insulating film of the SOI-MOSFET.

Figure 12:
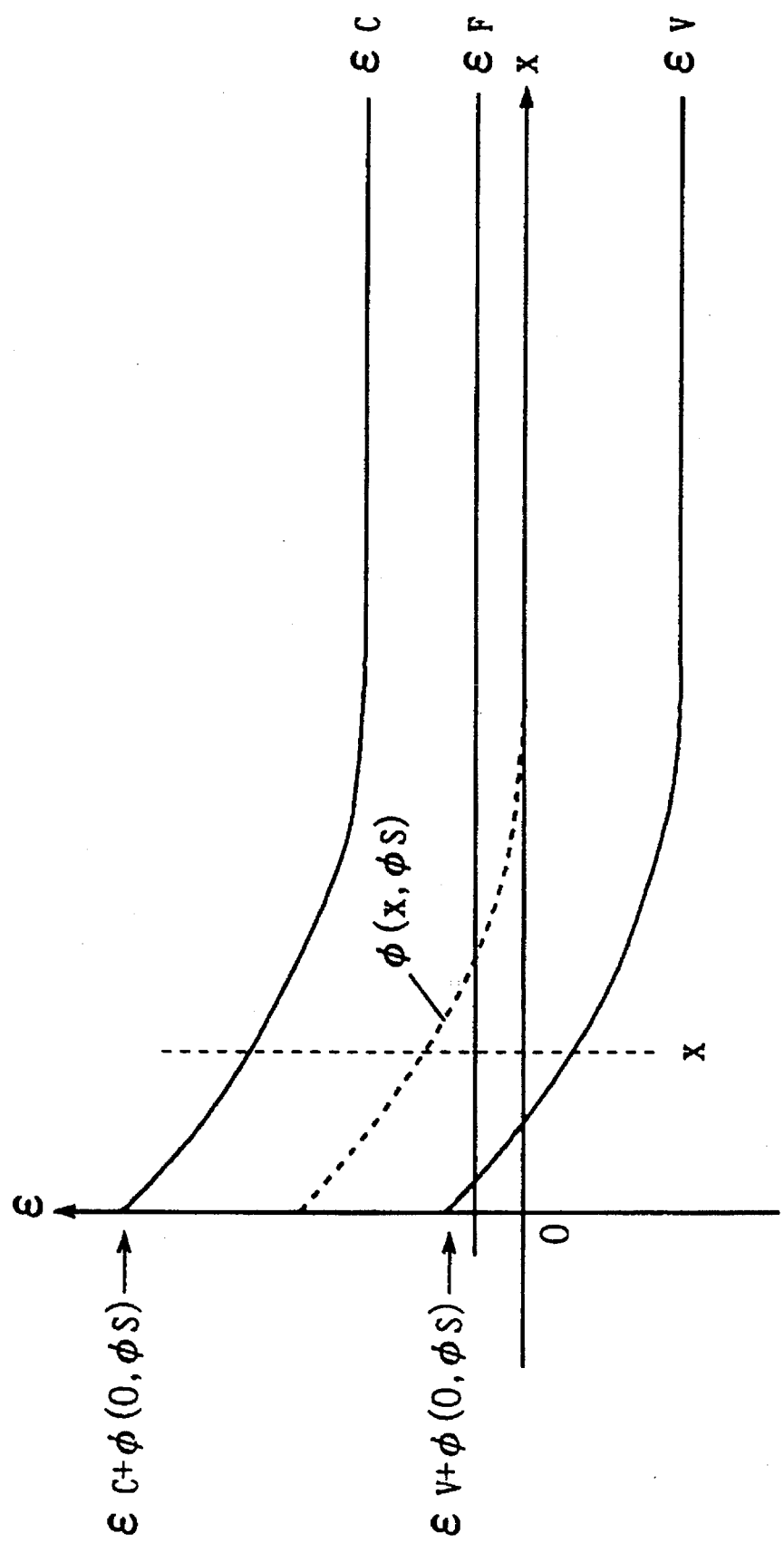
FIG. 12 is a graph schematically showing an energy band structure in a channel layer of a TFT.

FIG. 12 shows an example of an energy band structure in the channel layer of polycrystalline silicon in the TFT. In the graph of FIG. 12, the abscissa x represents depth from the surface (x=0) from the surface of the channel layer, and the ordinate $\epsilon$ represents energy potential level with reference to intrinsic Fermi level ($\epsilon$=0). The reference character $\epsilon_v$ represents energy level of an upper limit of a valence band, $\epsilon_c$ represents energy level of a lower limit of a conduction band, $\epsilon_F$ represents actual Fermi energy level, and $\phi(x, \phi_s)$ represents potential at position x when the surface potential of the channel layer is $\phi_s$.

The proportional constants $m_1$ and $m_2$ in expressions (9) and (10) can be calculated by the following expressions (11) and (12), taking into consideration the energy band structure such as shown in FIG. 12:

$$m_1 = \frac{q\xi}{C_{ox}} \left[ 1 + \frac{2\int_0^{t_p}\int_{-\infty}^{+\infty} \{n_{db}(x, \epsilon - \phi(x, \Delta\phi_s)) \cdot p_h(x, \epsilon - \phi(x, \Delta\phi_s)) - n_{db}((x, \epsilon) \cdot p_h(x, \epsilon))\}\{1 - f(\epsilon)\}d\epsilon \cdot dx}{\int_0^{t_p}\int_{-\infty}^{+\infty} n_{db}(x, \epsilon) \cdot p_h(x, \epsilon)d\epsilon \cdot dx} \right] \quad (11)$$

$$m_2 = \frac{\dfrac{2q}{C_{ox}} \int_0^{t_p}\int_{-\infty}^{+\infty} [n_{db}(x, \epsilon - \phi(x, \Delta\phi_s))\{1 - p_h(x, \epsilon - \phi(x, \Delta\phi_s))\} - n_{db}(x, \epsilon)\{1 - p_h(x, \epsilon)\}]\{1 - f(\epsilon)\}d\epsilon \cdot dx}{\int_0^{t_p}\int_{-\infty}^{+\infty} n_{db}(x, \epsilon)\{1 - p_h(x, \epsilon)\}d\epsilon \cdot dx} \quad (12)$$

where $\zeta$ represents degree of dissociation of Si-H coupling caused by −BT stress, $C_{ox}$ represents capacitance of gate insulating film, $n_{db}(x, \epsilon)$ and $P_h(x, \epsilon)$ represent dangling bond density and ratio of hydrogenation per unit energy and per unit volume at a position having potential $\epsilon$ and at a depth x from the channel surface, respectively, $\Delta\phi_s$ represents amount in change of the surface potential until TFT reaches the threshold voltage condition from flat band condition, and $t_p$ represents thickness of the polycrystalline silicon film.

The degree of dissociation $\zeta$ of Si-H coupling in expression (11) can be represented by the following expression (13), where T represents temperature at the time of −BT stress and the stress electric field E is $E=|V_G|/t_{ox}$:

$$\xi = \left(\frac{t}{t_s}\right)^\alpha \exp\left\{ -\frac{q}{kT}\left(\phi_0 - \frac{d|V_G|}{2t_{ox}}\right) \right\} \quad (13)$$

where the values $\phi$ and $\phi_0$ in expression (13) can be calculated by utilizing −BT stress test using the jumbo TFT, as in the embodiment of FIG. 10. Therefore, the degree of dissociation $\zeta$ can be determined. As for the constant $t_s$ in expression (13), it can be determined by the comparison of the dangling bond density $N_{db}$ calculated in accordance with expressions (9), (11), (12), and (13) while leaving $t_s$ unknown, with the dangling bond density $N_{db}$ measured by the ESR apparatus for a single polycrystalline silicon thin film manufactured under the same condition on a polycrystalline silicon thin film incorporated in the TFT. Once the constant $t_s$ is determined, the dangling bond density can be estimated in any TFT, since $t_s$ is independent from the manufacturing condition of the TFT. One example of the value $t_s$ obtained through experiment by the inventors was 5200 sec.

Now, if the value x is small, the values $n_{db}(x, \epsilon)$, $P_h(x, \epsilon)$ and $\phi(x, \phi_s)$ are not dependent on the position, and assuming that there is not energy dependency in the band gap, the following expressions (14), (15) and (16) can be applied. Further, Fermi distribution function $f(\epsilon)$ can be approximated by the following expression (17):

$$n_{db}(x,\epsilon) = \begin{cases} 0 & (\epsilon_c < \epsilon) \\ N_{DB}/E_g & (\epsilon_v < \epsilon < \epsilon_c) \\ 0 & (\epsilon < \epsilon_v) \end{cases} \quad (14)$$

$$P_h(x,\epsilon) = \begin{cases} 0 & (\epsilon_c < \epsilon) \\ P_H & (\epsilon_c < \epsilon < \epsilon_v) \\ 0 & (\epsilon < \epsilon_v) \end{cases} \quad (15)$$

$$\phi(x, \phi_s) = \phi_s \quad (16)$$

$$f(\epsilon) = \begin{cases} 0 & (\epsilon_F \leq \epsilon) \\ 1 & (\epsilon < \epsilon_F) \end{cases} \quad (17)$$

where reference character $E_G$ in expression (14) represents band gap, which corresponds to $(\epsilon_c - \epsilon_v)$.

Therefore, by utilizing these approximation expressions (14) to (17), the expressions (11) and (12) for calculating proportional constants $m_1$ and $m_2$ can be simplified, as expressed by the following expressions (18) and (19):

$$m_1 = \frac{q\xi t_p}{C_{ox}}\left(1 + 2\frac{\Delta\phi_s}{E_g}\right) \quad (18)$$

$$m_2 = 2\frac{q t_p}{C_{ox}} \cdot \frac{\Delta\phi_s}{E_g} \quad (19)$$

Figure 13:
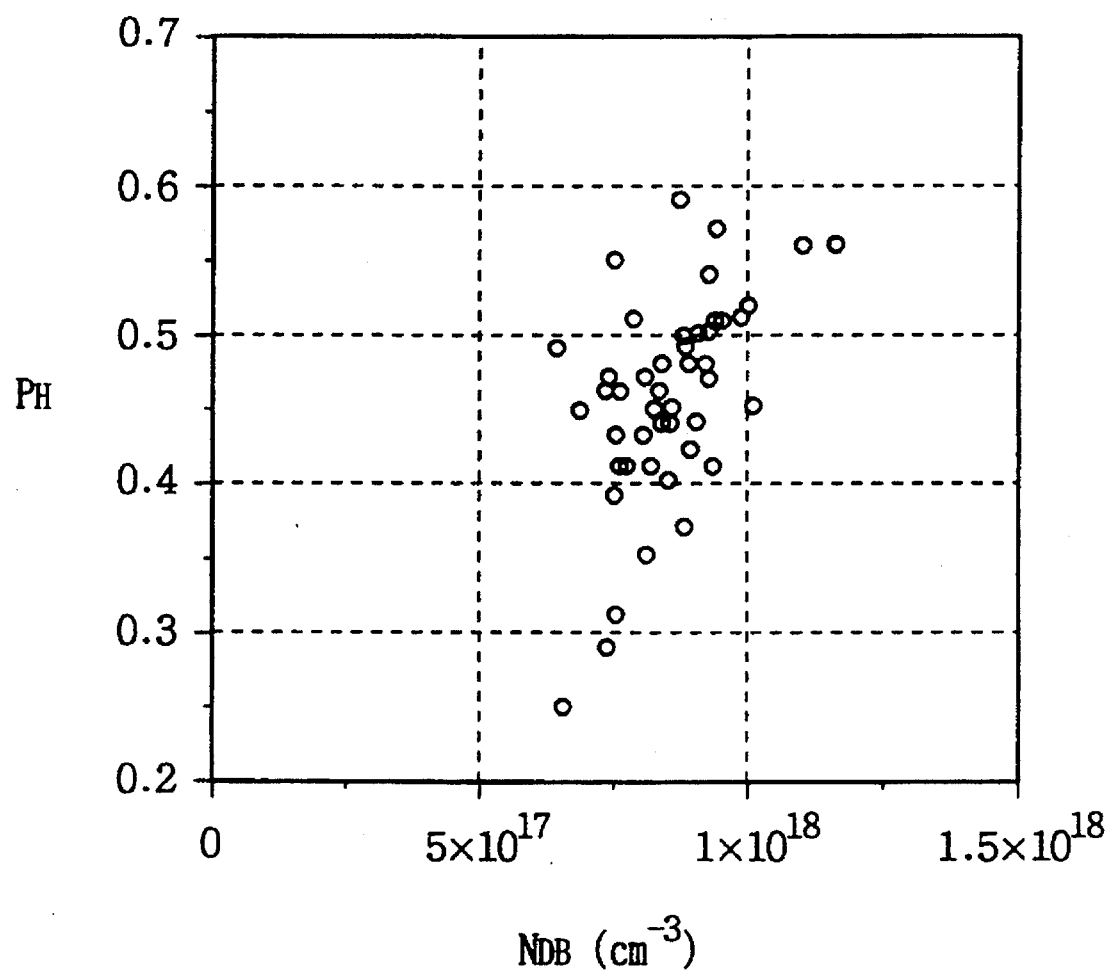
FIG. 13 is a graph showing variations in dangling bond density and ratio of hydrogenation in a plurality of TFTs manufactured under the same manufacturing conditions.
Figure 16:
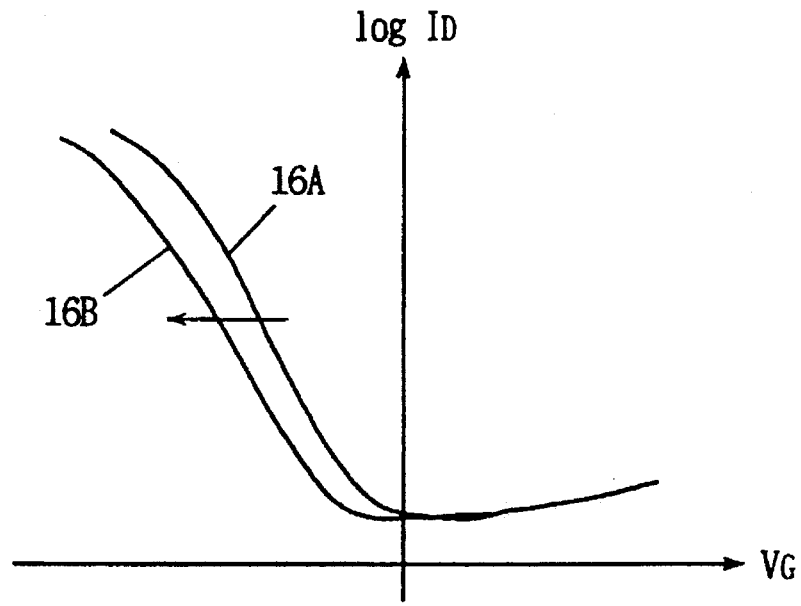
FIG. 16 is a graph showing an example of shift in the threshold voltage caused by −BT stress in the TFT.
Figure 17:
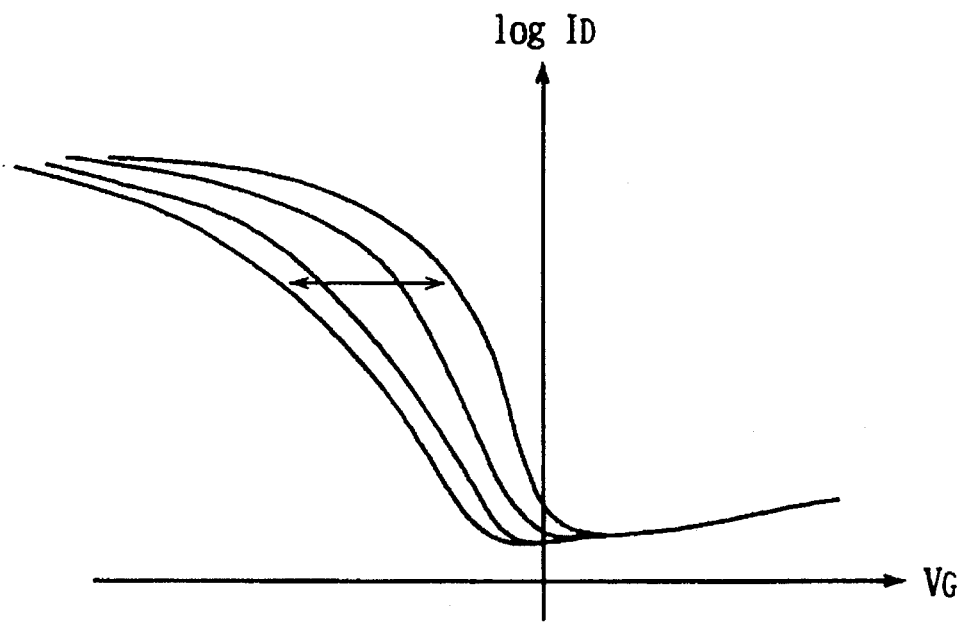
FIG. 17 is a graph showing variation in initial characteristics in a plurality of TFTs manufactured under the same manufacturing condition.

FIG. 13 shows the relation of the dangling bond density $N_{DB}$ and the ratio of hydrogenation $P_H$ of the individual TFT measured in FIG. 1 calculated through expressions (9), (10), and (13), (18) and (19).

The method of calculating the dangling bond density and the ratio of hydrogenation described above may also be applied for calculating the dangling bond density and the ratio of hydrogenation at an interface between the gate insulating film and the channel layer in a single crystal MOS transistor.

As described above, according to the present invention, life of a single TFT is predicted by utilizing −BT stress test. Therefore, an accurate and efficient method of evaluating reliability of a single TFT can be provided.

Further, according to the present invention, a method of evaluating the dangling bond density and the ratio of hydrogenation in a channel layer of polycrystalline silicon, which are closely related to the reliability of the TFT can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a TFT having a channel layer of a polycrystalline silicon thin film and a gate insulating film of a silicon oxide film manufactured under a prescribed manufacturing condition, a method of evaluating reliability of the TFT in −BT stress state in which the gate is supplied with an arbitrary negative constant voltage $V_G$ and maintained at an arbitrary constant temperature T based on the following expressions:

$$\Delta V_{th} \propto t^\alpha \quad (2a)$$

$$\Delta V_{th} \propto \exp\frac{qd|V_G|}{2kTt_{ox}} \quad (3a)$$

$$\Delta V_{th} \propto \exp\left\{ -\frac{q}{kT}\left(\phi_0 - \frac{d|V_G|}{2t_{ox}}\right) \right\} \quad (4a)$$

$$\Delta V_{th} = \Delta V_{th0} \left(\frac{t}{t_0}\right)^\alpha \exp\left\{ -\frac{q}{kT}\left(\phi_0 - \frac{d|V_G|}{2t_{ox}}\right) \right\} \quad (5)$$

-continued $$\tau_0 = t_0 \left( \frac{\Delta V_{th\tau}}{\Delta V_{th0}} \right)^\beta \exp\frac{\beta q \phi_0}{kT} \exp\left( -\frac{\beta q d |V_G|}{2kTt_{ox}} \right) \quad (7)$$

$$\tau = t_0 \left\{ \frac{\Delta V_{th\tau}/(1 - m|\sigma/\mu|)}{\Delta V_{th0}} \right\}^\beta \exp\frac{\beta q \phi_0}{kT} \exp\left( -\frac{\beta q d |V_G|}{2kTt_{ox}} \right) \quad (8)$$

where $\Delta V_{th}$ represents threshold voltage shift amount of a jumbo TFT including a plurality of TFTs connected parallel to each other and manufactured under said prescribed manufacturing condition, t time, $\alpha$ time coefficient, q elementary electric charge, d voltage coefficient, k Boltzman constant, $t_{ox}$ thickness of the gate oxide film, $\phi_0$ temperature coefficient, $\Delta V_{th\tau}$ tolerant threshold voltage shift amount for the TFT, $\mu$ and $\sigma$ mean value and standard deviation, respectively, of threshold voltage shift amounts of the plurality of TFTs manufactured under said prescribed manufacturing condition, m a constant, and $\beta=1/\alpha$, the method comprising the steps of:

determining time coefficient $\alpha$ in expression (2a) based on a relation between threshold voltage shift amount $\Delta V_{th}$ obtained from at least one −BT stress test and time t;

determining voltage coefficient d in expression (3a) based on a relation between gate voltage $V_G$ and the threshold voltage shift amount $\Delta V_{th}$ obtained from at least two −BT stress tests using different gate voltages $V_G$;

determining temperature coefficient $\phi_0$ in equation (4a) based on a relation between temperature T and the threshold voltage shift amount $\Delta V_{th}$ obtained from at least two −BT stress tests at different temperatures T;

determining proportional constant $$\Delta V_{th0} \left( \frac{1}{t_0} \right)^\alpha \equiv C_2$$

in expression (5) obtained from a relation between expressions (2a), (3a) and (4a), by using determined time coefficient $\alpha$, voltage coefficient d and temperature coefficient $\phi_0$; and calculating life $\tau$ of a single TFT manufactured under said prescribed manufacturing condition, by using expression (8) which is obtained by substituting $\Delta V_{th\tau}/(1+m|\sigma/\mu|)$ for $\Delta V_{th\tau}$ in expression (7) for calculating life $\tau_0$ of the jumbo TFT, which expression is obtained by converting expression (5) based on the determined proportional constant $c_2$ and the tolerant threshold voltage shift amount $\Delta V_{th\tau}$ of the jumbo TFT.

2. The method of evaluating reliability of a TFT according to claim 1, further comprising the steps of:
in −BT stress test for a TFT (a) manufactured under a first manufacturing condition and a TFT (b) manufactured under a second manufacturing condition, calculating threshold voltage shift amounts $\Delta V_{tha}$ and $\Delta V_{thb}$ of a jumbo TFT (a) and a jumbo TFT (b) under a condition where temperature T and gate electric field $V_G/t_{ox}$ at a certain time point t are the same; replacing $\Delta V_{th0}$ in equation (7) calculated for said jumbo TFT (a) by $\Delta V_{th0} \cdot \Delta V_{thb}/\Delta V_{tha}$ and replacing $\Delta V_{th\tau}$ by $\Delta V_{th\tau}/(1+m|\sigma/\mu|)$ by using mean value $\mu$ and standard deviation $\sigma$ of the threshold voltage shift amount of either one of a plurality of said TFTs (a) and a plurality of said TFTs (b) to obtain an equation (8a) below:

$$\tau = \quad (8a)$$

$$t_0 \left\{ \frac{\Delta V_{th\tau}/(1 - m|\sigma/\mu|)}{\Delta V_{th0} \cdot \Delta V_{thb}/\Delta V_{tha}} \right\}^\beta \exp\frac{\beta q \phi_0}{kT} \exp\left( -\frac{\beta q d |V_G|}{2kTt_{ox}} \right)$$

; and using the equation (8a), estimating life $\tau$ of a single said TFT (b).

3. In a TFT having a channel layer formed of a silicon thin film and a gate insulating film of silicon oxide film and manufactured under a predetermined condition, a method of evaluating reliability of the TFT in a −BT stress state in which the gate is supplied with an arbitrary negative constant voltage $V_G$ and held at a predetermined constant temperature T based on following expressions:

$$\Delta V_{th} \propto t^\alpha \quad (2a)$$

$$\Delta V_{th} \propto \exp\frac{qd|V_G|}{2kTt_{ox}} \quad (3a)$$

$$\Delta V_{th} = \Delta V_{th0} \left( \frac{t}{t_0} \right)^\alpha \exp\frac{qd|V_G|}{2kT_0t_{ox}} \quad (5b)$$

$$\tau_0 = t_0 \left( \frac{\Delta V_{th\tau}}{\Delta V_{th0}} \right)^\beta \exp\left( -\frac{\beta q d |V_G|}{2kT_0t_{ox}} \right) \quad (7b)$$

$$\tau = t_0 \left\{ \frac{\Delta V_{th\tau}/(1 - m|\sigma/\mu|)}{\Delta V_{th0}} \right\}^\beta \exp\left( -\frac{\beta q d |V_G|}{2kT_0t_{ox}} \right) \quad (8b)$$

where $\Delta V_{th}$ represents threshold voltage shift amount of a jumbo TFT including a plurality of TFTs connected parallel to each other and manufactured under said prescribed manufacturing condition, t time, $\alpha$ time coefficient, q elementary electric charge, d voltage coefficient, k Boltzman constant, $t_{ox}$ thickness of the gate oxide film, $\Delta V_{th\tau}$ tolerant threshold voltage shift amount for said jumbo TFT, $\mu$ and $\sigma$ mean value and standard deviation, respectively, of the threshold voltage shift amounts of the plurality of TFTs manufactured under said prescribed manufacturing condition, m a constant, and $\beta=1/\alpha$, the method comprising the steps of determining time coefficient $\alpha$ in expression (2a) based on a relation between time t and threshold voltage shift amount $\Delta V_{th}$ obtained from at least one −BT stress test;

determining voltage coefficient d in expression (3a) based on a relation between gate voltage $V_G$ and the threshold voltage shift amount $\Delta V_{th}$ obtained from at least two −BT stress tests using different gate voltages;

determining a proportional coefficient $$\Delta V_{th0} \left( \frac{1}{t_0} \right)^\alpha \equiv C_2$$

by using determined time coefficient $\alpha$ and voltage coefficient d in expression (5b) obtained from a relation between expressions (2a) and (3a); and calculating life $\tau$ of a single TFT manufactured under said prescribed manufacturing condition by using an expression (8b) obtained by substituting $\Delta V_{th\tau}/(1+m|\sigma/\mu|)$ for $\Delta V_{th\tau}$ in expression (7b) for calculating life $\tau_0$ of the jumbo TFT which expression is obtained by converting expression (5b) from the determined proportional coefficient $c_2$ and the tolerant threshold voltage shift amount $\Delta V_{th\tau}$ of the jumbo TFT.

4. The method of evaluating reliability of a TFT according to claim 3, further comprising the steps of: in −BT stress test for a TFT (a) manufactured under a first manufacturing condition and a TFT (b) manufactured under a second manufacturing condition, calculating threshold voltage shift amounts $\Delta V_{tha}$ and $\Delta V_{thb}$ of a jumbo TFT (a) and a jumbo TFT (b) under a condition where temperature T and gate electric field $V_G/t_{ox}$ at a certain time point t are the same; replacing $\Delta V_{th0}$ in equation (7b) calculated for said jumbo TFT (a) by $\Delta V_{th0} \cdot \Delta V_{thb}/\Delta V_{tha}$ and replacing $\Delta V_{th\tau}$ by $\Delta V_{th\tau}/(1+m|\sigma/\mu|)$ by using mean value $\mu$ and standard deviation $\sigma$ of the threshold voltage shift amount of either one of a plurality of said TFTs (a) and a plurality of said TFTs (b) to obtain an equation (8c) below:

$$\tau = t_0 \left\{ \frac{\Delta V_{th\tau}/(1 - m|\sigma/\mu|)}{\Delta V_{th0} \cdot \Delta V_{thb}/\Delta V_{tha}} \right\}^\beta \exp\left( -\frac{\beta q d |V_G|}{2kT_0 t_{ox}} \right) \quad (8c)$$

; and using the equation (8a), estimating life $\tau$ of a single said TFT (b).

5. In a TFT having a channel layer formed of polycrystalline silicon thin film and a gate insulating film of a silicon oxide film and manufactured under a prescribed manufacturing condition, a method of evaluating reliability of the TFT in a –BT stress state in which the gate is supplied with a predetermined negative constant voltage $V_G$ and maintained at an arbitrary constant temperature T using the following expressions:

$$\Delta V_{th} \propto t^\alpha \quad (2a)$$

$$\Delta V_{th} \propto \exp\left( -\frac{q\phi_E}{kT} \right) \quad (4b)$$

$$\Delta V_{th} = \Delta V_{th0} \left( \frac{t}{t_0} \right)^\alpha \exp\left( -\frac{q\phi_E}{kT} \right) \quad (5c)$$

$$\tau_0 = t_0 \left( \frac{\Delta V_{th\tau}}{\Delta V_{th0}} \right)^\beta \exp\frac{\beta q\phi_E}{kT} \quad (7c)$$

$$\tau = t_0 \left\{ \frac{\Delta V_{th\tau}/(1 - m|\sigma/\mu|)}{\Delta V_{th0}} \right\}^\beta \exp\frac{\beta q\phi_E}{kT} \quad (8d)$$

where $\Delta V_{th}$ represents threshold voltage shift amount of a jumbo TFT including a plurality of TFTs connected parallel to each other and manufactured under said prescribed manufacturing condition, t time, $\alpha$ time coefficient, k Boltzman constant, $\phi_E$ temperature coefficient, $\Delta V_{th\tau}$ tolerant threshold voltage shift amount of the TFT, $\mu$ and $\sigma$ mean value and standard deviation, respectively, of threshold voltage shift amounts of the plurality of TFTs manufactured under said prescribed manufacturing condition, m a constant and $\beta=1/\alpha$, the method comprising the steps of determining time coefficient $\alpha$ in equation (2a) based on a relation between time t and threshold voltage shift amount $\Delta V_{th}$ obtained from at least one –BT stress test;

determining temperature coefficient $\phi_E$ in expression (4b) based on a relation between temperature T and the threshold voltage shift amount $\Delta V_{th}$ obtained from at least two –BT stress tests at different temperatures T;

determining proportional constant $$\Delta V_{th0} \left( \frac{1}{t_0} \right)^\alpha \equiv C_2$$

using determined time coefficient $\alpha$ and temperature coefficient $\phi_E$ in expression (5c) obtained from a relation between expressions (2a) and (4b); and calculating life $\tau$ of a single TFT manufactured under said prescribed manufacturing condition by using expression (8d) obtained by substituting $\Delta V_{th\tau}/(1+m|\sigma/\mu|)$ for $\Delta V_{th\tau}$ with respect to (7c) for calculating life $\tau_0$ of jumbo TFT obtained by converting expression (5c) based on the determined proportional coefficient $c_2$ and tolerant threshold voltage shift amount $\Delta V_{th\tau}$ of the TFT.

6. The method of evaluating reliability of a TFT according to claim 5, further comprising the steps of: in –BT stress test for a TFT (a) manufactured under a first manufacturing condition and a TFT (b) manufactured under a second manufacturing condition, calculating threshold voltage shift amounts $\Delta V_{tha}$ and $\Delta V_{thb}$ of a jumbo TFT (a) and a jumbo TFT (b) under a condition where temperature T and gate electric field $V_G/t_{ox}$ at a certain time point t are the same; replacing $\Delta V_{th0}$ in equation (7c) calculated for said jumbo TFT (a) by $\Delta V_{th0} \cdot \Delta V_{thb}/\Delta V_{tha}$ and replacing $\Delta V_{th\tau}$ by $\Delta V_{th\tau}/(1+m|\sigma/\mu|)$ by using mean value $\mu$ and standard deviation $\sigma$ of the threshold voltage shift amount of either one of a plurality of said TFTs (a) and a plurality of said TFTs (b) to obtain an equation (8e) below:

$$\tau = t_0 \left\{ \frac{\Delta V_{th\tau}/(1 - m|\sigma/\mu|)}{\Delta V_{th0} \cdot \Delta V_{thb}/\Delta V_{tha}} \right\}^\beta \exp\frac{\beta q\phi_E}{kT} \quad (8e)$$

; and using the equation (8e), estimating life $\tau$ of a single said TFT (b).

7. In a TFT having a channel layer of a polycrystalline silicon thin film and a gate insulating film of a silicon oxide film and manufactured under a prescribed manufacturing condition, a method of evaluating reliability of the TFT utilizing –BT stress test in which the gate is supplied with a predetermined negative constant voltage $V_G$ and maintained at an arbitrary constant temperature T, using following expressions:

$$\Delta V_{th} \propto t^\alpha \quad (2a)$$

$$\Delta V_{th} \propto \exp\frac{q d |V_G|}{2kT t_{ox}} \quad (3a)$$

$$\Delta V_{th} \propto \exp\left\{ -\frac{q}{kT} \left( \phi_0 - \frac{d|V_G|}{2t_{ox}} \right) \right\} \quad (4a)$$

$$N_{DB} = \frac{|\Delta V_{thi}|}{m_1} + \frac{|V_{th0i} - V_{ths}|}{m_2} \quad (9)$$

$$P_H = \frac{1}{1 + \frac{m_1}{m_2} \left| \frac{V_{th0i} - V_{ths}}{\Delta V_{thi}} \right|} \quad (10)$$

$$m_1 = \frac{q\xi}{C_{ox}} \left[ 1 + \frac{2\int_0^{t_p}\int_{-\infty}^{+\infty} \begin{array}{l} \{n_{db}(x, \epsilon - \phi(x, \Delta\phi_s)) \cdot \\ p_h(x, \epsilon - \phi(x, \Delta\phi_s)) - \\ n_{db}((x, \epsilon) \cdot p_h(x, \epsilon))\}\{1 - f(\epsilon)\}d\epsilon \cdot dx \end{array}}{\int_0^{t_p}\int_{-\infty}^{+\infty} n_{db}(x, \epsilon) \cdot p_h(x, \epsilon)d\epsilon \cdot dx} \right] \quad (11)$$

$$m_2 = \frac{\frac{2q}{C_{ox}}\int_0^{t_p}\int_{-\infty}^{+\infty} \begin{array}{l}\{n_{db}(x, \epsilon - \phi(x, \Delta\phi_s))\{1 - \\ p_h(x, \epsilon - \phi(x, \Delta\phi_s))\} - \\ n_{db}(x, \epsilon)\{1 - p_h(x, \epsilon)\}\}\{1 - f(\epsilon)\}d\epsilon \cdot dx\end{array}}{\int_0^{t_p}\int_{-\infty}^{+\infty} n_{db}(x, \epsilon)\{1 - p_h(x, \epsilon)\}d\epsilon \cdot dx} \quad (12)$$

$$\xi = \left( \frac{t}{t_s} \right)^\alpha \exp\left\{ -\frac{q}{kT} \left( \phi_0 - \frac{d|V_G|}{2t_{ox}} \right) \right\} \quad (13)$$

where $\Delta V_{th}$ represents threshold voltage shift amount of a jumbo TFT including a plurality of TFTs connected parallel to each other and manufactured under said prescribed manufacturing condition, t time, $\alpha$ time coefficient, q elementary electric charge, d voltage coefficient, k Boltzman constant, $t_{ox}$ thickness of the gate oxide film, $\phi_0$ time coefficient, $N_{DB}$ and $P_H$ dangling bond density and ratio of hydrogenation of silicon atoms in said polycrystalline thin film, $m_1$ and $m_2$ proportional constants, $V_{th0i}$ and $\Delta V_{thi}$ initial threshold voltage and threshold voltage shift amount in a single TFT manufactured under prescribed manufacturing condition, $V_{ths}$ initial threshold voltage of an SOI-MOSFET having same size and shape as the TFT, $\zeta$ degree of dissociation of Si-H coupling, $C_{ox}$ capacitance of gate insulating film, $n_{db}$ (x, $\epsilon$) and $P_h$ (x, $\epsilon$) dangling bond density and ratio of hydrogenation, respectively, per unit energy and per unit volume at a position having energy potential $\epsilon$ with reference to an intrinsic Fermi level at a depth x from the surface of the channel layer, f ($\epsilon$) Fermi distribution function, $\phi$ (x, $\phi_s$) potential at position x when surface potential is $\phi_s$, $t_p$ thickness of said polycrystalline silicon thin film, $\Delta\phi_s$ amount of change in surface potential of the TFT reaching the threshold voltage condition from flat bond condition, and $t_s$ a constant, the method comprising the steps of determining time coefficient $\alpha$ in expression (2a) based on a relation between time t and the threshold voltage shift amount $\Delta V_{th}$ obtained from at least one −BT stress test;

determining voltage coefficient d in expression (3a) based on a relation between gate voltage $V_G$ and threshold voltage shift amount $\Delta V_{th}$ obtained from at least two −BT stress tests using different gate voltages $V_G$;

determining temperature coefficient $\phi_0$ in equation (4a) based on a relation between temperature T and threshold voltage shift amount $\Delta V_{th}$ obtained from at least two −BT stress tests at different temperatures T; and calculating said dangling bond density $N_{DB}$ and said ratio of hydrogenation $P_H$ from expressions (9) to (13) using the determined time coefficient $\alpha$, voltage coefficient d and temperature coefficient $\phi_0$.

8. The method of evaluating reliability of a TFT according to claim 7, wherein said equations (11) and (12) are replaced by respective approximation equations (18) and (19)

$$m_1 = \frac{q\zeta t_p}{C_{ox}} \left(1 + 2\frac{\Delta\phi_s}{E_g}\right) \quad (18)$$

$$m_2 = 2\frac{qt_p}{C_{ox}} \cdot \frac{\Delta\phi_s}{E_g} \quad (19)$$

where $E_G$ represents energy band gap in said polycrystalline silicon thin film.

* * * * *